(12) United States Patent
Park et al.

(10) Patent No.: US 7,205,199 B2
(45) Date of Patent: Apr. 17, 2007

(54) METHOD OF FORMING A RECESS CHANNEL TRENCH PATTERN, AND FABRICATING A RECESS CHANNEL TRANSISTOR

(75) Inventors: Jong-Chul Park, Gyeonggi-do (KR); Yong-Sun Ko, Gyeonggi-do (KR); Tae-Hyuk Ahn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 10/917,615

(22) Filed: Aug. 13, 2004

(65) Prior Publication Data
US 2005/0077568 A1    Apr. 14, 2005

(30) Foreign Application Priority Data
Oct. 10, 2003    (KR)    ............... 10-2003-0070638

(51) Int. Cl.
*H01L 21/336*    (2006.01)

(52) U.S. Cl. ............... 438/270; 438/259; 438/271; 257/330

(58) Field of Classification Search ............... 438/270, 438/259, 271; 257/330
See application file for complete search history.

(56) References Cited

U.S. PATENT DOCUMENTS 6,440,794 B1 *    8/2002    Kim ............... 438/248

2002/0094622 A1    7/2002    Sneelal et al.

FOREIGN PATENT DOCUMENTS

| JP | 10-70253 | 3/1998 |
|----|----------|--------|
| KR | 1999-74949 | 10/1999 |
| KR | 2002-50371 | 6/2002 |

OTHER PUBLICATIONS

English language abstract of Korean Publication No. 2002-50371.
English language Abstract from Japanese Patent No. JP10-70253.
English language Abstract from Korean Patent No. KR1999-74949.

* cited by examiner

*Primary Examiner*—Doug Menz
(74) *Attorney, Agent, or Firm*—Marger Johnson & McCollom, P.C.

(57) ABSTRACT

A method of forming a recess channel trench pattern for forming a recess channel transistor is provided. A mask layer is formed on a semiconductor substrate, which is then patterned to expose an active region and a portion of an adjacent device isolating layer with an isolated hole type pattern. Using this mask layer the semiconductor substrate and the device isolating layer portion are selectively and anisotropically etched, thereby forming a recess channel trench with an isolated hole type pattern. The mask layer may be patterned to be a curved line type. In this case, the once linear portion is curved to allow the device isolating layer portion exposed by the patterned mask layer to be spaced apart from an adjacent active region. The semiconductor substrate and the device isolating layer portion are then etched, thereby forming a recess channel trench with a curved line type pattern.

10 Claims, 30 Drawing Sheets

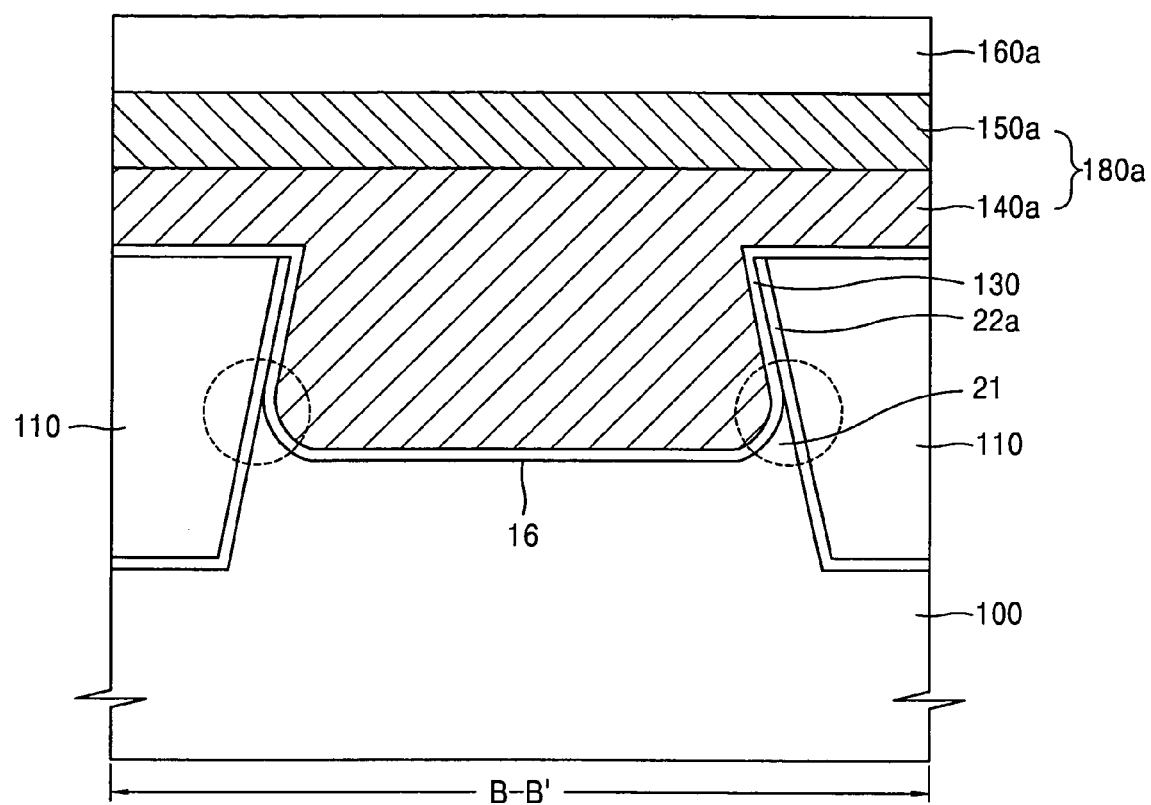

METHOD OF FORMING A RECESS CHANNEL TRENCH PATTERN, AND FABRICATING A RECESS CHANNEL TRANSISTOR

BACKGROUND OF THE INVENTION

This application claims the priority of Korean Patent Application No. 2003-70638, filed on Oct. 10, 2003, in the Korean Intellectual Property Office, the disclosure of which is incorporated herein in its entirety by reference.

1. Field of the Invention

The present invention relates to a semiconductor integrated circuit device and a manufacturing method thereof, and more particularly to a recess channel transistor (RCT) used for a highly integrated semiconductor circuit, a method of fabricating the same, and a method of forming a recess channel trench pattern.

2. Description of the Related Art

Lengths of channels are being shortened as a result of high integration density in semiconductor devices such as DRAMs, causing problems such as the short channel effect and punch through between source and drain regions, of which influences are difficult to control. Therefore, recess channel transistors are suggested for increasing the lengths of channels.

In a recess channel transistor, a recess channel trench is formed in an active region defined by a device isolation structure such as a shallow trench isolation (STI). Then, a recess gate that fills the recess channel trench, and source and drain regions that are formed in both sides of the recess gate form the recess channel transistor. Thus, a channel is formed along an outer periphery of the recess channel trench that is much longer than a length of a channel in a planar-type transistor. By doing so, short channel effect is decreased, and punchthrough between the source and drain regions is inhibited.

However, in a conventional method of forming a recess channel trench pattern that forms a recess channel transistor, a pattern of a mask layer (e.g., a photoresist pattern) for forming the recess channel trench is shaped as a straight line. Using the mask layer with the straight-line shaped pattern, a silicon substrate of an active region and an isolating layer of a field region disposed under the mask layer are etched, thereby forming a recess channel trench in the field region as well as in the active region. At this time, an etch selectivity of the silicon substrate to the isolating layer is heightened, so that the depth of the recess channel trench in the field region is less than that formed in the active region.

FIG. 1 is a layout showing a conventional recess channel trench pattern.

Referring to FIG. 1, active regions 22, 24, 26 and 28 that form recess channel transistors are separated by STIs that form field oxide regions 110. Straight-line shaped recess channel trench patterns 12, 14, 16 and 18 are formed across the active regions 22, 24, 26 and 28 and field region 110. The straight-line shaped recess channel trench patterns 12, 14, 16 and 18 are formed by etching the active regions and the field oxide regions.

FIGS. 2A and 2B are sectional views respectively taken along lines A–A' and B–B' of FIG. 1.

Referring to FIG. 2A, the STI 110 sloped by a prescribed angle is formed in a silicon substrate 100. Also, recess channel trenches 14 and 16 with a prescribed depth H1 are formed in the silicon substrate 100 that forms the active regions between the STIs 110. As described with reference to FIG. 1, the STI 110 that forms the field region is formed with the recess channel trenches 12 and 18 to a depth H2 that is shallower than the depth H1. The silicon substrate forming the active regions is formed with source and drain regions (not shown). The aforementioned recess channel trenches 12, 14, 16 and 18 are formed by etching the silicon substrate and isolating layer using the mask layer 115 such as a photoresist layer patterned to have the straight line shape as an etch mask.

However, in the recess channel trench with the foregoing sectional structure, the recess channel trench 18 in the field region is apt to intrude into a STI liner 22a that protects the STI as indicated by a dot-lined circle 11 of FIGS. 1 and 2A.

Therefore, a recess gate that is formed later may (electrically) short with the active region through the STI liner 22a. Since a conventional STI structure has a positive slope to secure a gap fill margin of the isolating layer, the liability of causing a short between the recess gate and the active region is further increased in proportion with a depth of the recess channel trench 18 in the field region. Moreover, further decreasing device size causes a reduction in a misalignment margin of the recess channel trench pattern for the purpose of evading the possible short. Even if the recess gate is not actually shorted, mutual interference caused as a result of making the recess channel trench 18 nearer to the substrate material 100 of the active region may bring about an abnormal operation of the recess channel transistor.

Referring to FIG. 2B, in the conventional recess channel trench structure, the active region is formed with the recess channel trench 16 with the depth H1 that is deeper than the prescribed depth H2 formed by etching the field region. The etched amounts are different because the etch selectivity of the silicon substrate material to the isolating layer that forms the STI is large. On the other hand, according to the conventional method of forming the recess channel trench, etching is carried out to form the recess channel trench 16 using the STI 110 with the positive slope as a boundary. Thus, silicon fences 21, or residual substrate areas, are formed on both bottom sides of the recess channel trench 16. That is, as areas 21 indicated by dot-lined circles, the silicon substrate 100 partially remains between the sidewalls of the STI 110 and the recess channel trench 16. If the silicon fences 21 are formed on both bottom sides of the recess channel trench 16 as stated above, the length of the channel around the silicon fence 21 is greatly decreased when forming a recess channel transistor later. Thus, characteristics such as threshold voltage of the transistor are deteriorated.

FIGS. 3A and 3B are sectional views showing a conventional recess channel transistor fabricated using the layout of FIG. 1, taken along lines A–A' and B–B' of FIG. 1, respectively.

Referring to FIG. 3A, a recess gate formed by a gate insulating layer 130, a gate polysilicon layer 140a, a gate metal layer 150a, and a capping layer 160a is formed on the recess channel trench 16, thereby forming the recess channel transistor. Referring to FIG. 3A, in the area 11 where the recess channel trench intrudes into the STI liner after the recess gate is formed, a gate conductive layer 180a of the recess gate is shorted with the silicon substrate 100 that forms the active region, which causes malfunction during operation of the transistor.

Referring to FIG. 3B, the length of the channel is shortened between the silicon fences 21 formed on both bottom sides of the recess channel trench (refer to FIG. 2B). Once the length of the channel is shortened between the silicon fences 21, the threshold voltage is decreased, thereby increasing a leakage current.

SUMMARY OF THE INVENTION

The present invention provides a method of forming a recess channel trench pattern capable of preventing a recess channel trench from intruding into a shallow trench isolation (STI) liner in a field region, thereby preventing a short between a recess gate and an active region and thoroughly avoiding residual substrate areas formed on both bottom sides of the recess channel trench.

The present invention also provides a method of fabricating a recess channel transistor capable of preventing a short between a recess gate and an active region, and thoroughly avoiding residual substrate areas formed on both bottom sides of the recess channel trench.

According to an aspect of the present invention, there is provided a method of forming a recess channel trench pattern, which includes forming a device isolating layer in a semiconductor substrate that defines an active region. After forming a mask layer on the semiconductor substrate, a mask pattern is formed so as to expose the active region and a portion of an adjacent device isolating layer in an isolated hole type pattern. Finally, the exposed semiconductor substrate and the portion of the device isolating layer are anisotropically etched using the mask pattern as an etch mask, thereby forming a recess channel trench with the isolated hole type pattern.

In this case, an etch selectivity of the semiconductor substrate material to the device isolating layer during anisotropic etching is set as 1:1. Whereas, the etch selectivity of the semiconductor substrate material to the isolating layer during anisotropic etching may be larger than 1:1.

Preferably, the bottom surface of the recess channel trench with the isolated hole type pattern formed by anisotropic etching is substantially flat.

According to another aspect of the present invention, a method of forming a recess channel trench pattern includes forming a device isolating layer in a semiconductor substrate that defines an active region, and forming a mask layer on the semiconductor substrate. Then, a mask pattern is formed so as to expose the semiconductor substrate and the adjacent isolating layer in a curved line type pattern, in which the mask pattern includes a curved portion so as to be further spaced apart from an adjacent active region. By anisotropically etching the exposed semiconductor substrate and the device isolating layer using the mask pattern as an etch mask, a recess channel trench with the curved line type pattern is then formed.

Here, an etch selectivity of the semiconductor substrate material to the isolating layer during anisotropic etching is preferably larger than 1:1.

According to one aspect of the present invention, there is provided a method of fabricating a recess channel transistor including forming an isolating layer on a semiconductor substrate that defines an active region. After forming a mask layer on the semiconductor substrate with the defined active region thereon, the mask layer is patterned to expose the active region and a portion of an adjacent isolating layer have in an isolated hole type pattern. Then, the exposed semiconductor substrate and the portion of the isolating layer are selectively and anisotropically etched using the patterned mask layer as an etch mask, thereby forming a recess channel trench with the isolated hole type pattern. Finally, a recess gate that fills the recess channel trench is formed.

According to another aspect of the present invention, a method of fabricating a recess channel transistor includes forming a device isolating layer in a semiconductor substrate that defines an active region. After forming a mask layer on the semiconductor substrate, a mask pattern is formed so as to expose a semiconductor substrate and an adjacent device isolating layer in a curved line type pattern. Here, the mask pattern includes a curved portion so as to be spaced apart from an adjacent active region. By anisotropically etching the exposed semiconductor substrate and the device isolating layer using the mask pattern as an etch mask, a recess channel trench with the curved line type pattern is formed. Then, a recess gate that fills the recess channel trench may also be formed.

At this time, the forming of the recess gate includes forming a gate insulating layer along an inner wall of the recess channel trench, and sequentially stacking a gate conductive layer and a capping layer that fill the recess channel trench on the gate insulating layer. Thereafter, the gate conductive layer and the capping layer are patterned to form the recess gate.

Here, the gate conductive layer may be formed by sequentially stacking a polysilicon layer and a gate metal layer that fill the recess channel trench.

Additionally, forming of source and drain regions in the active region may be included between the step of defining the active region and the step of forming the mask layer.

According to yet another aspect of the present invention, a recess channel transistor includes source and drain regions formed in an active region of a semiconductor substrate defined by a device isolating layer, and a recess gate formed by filling a recess channel trench in the semiconductor substrate. At this time, the width of the recess channel trench in a gate line direction at the level of the surface of the semiconductor substrate is larger than a width of the recess channel trench defined by the device isolating layer in the gate line direction at the depth of the bottom of the recess gate. Moreover, the bottom surface of the recess gate defined by the isolating layer is substantially flat.

Here, the recess gate includes a gate insulating layer formed along the recess channel trench, a gate conductive layer formed by filling the recess channel trench, and a capping layer. The gate conductive layer may be formed by sequentially stacking a polysilicon layer and a gate metal layer.

BRIEF DESCRIPTION OF THE DRAWINGS

The above and other features and advantages of the present invention will become more apparent by describing in detail exemplary embodiments thereof with reference to the attached drawings in which:

FIGS. 3A and 3B are sectional views showing a conventional recess channel transistor fabricated by means of the layout of FIG. 1, respectively taken along lines A–A' and B–B' of FIG. 1;

DETAILED DESCRIPTION OF THE INVENTION

Figure 1:
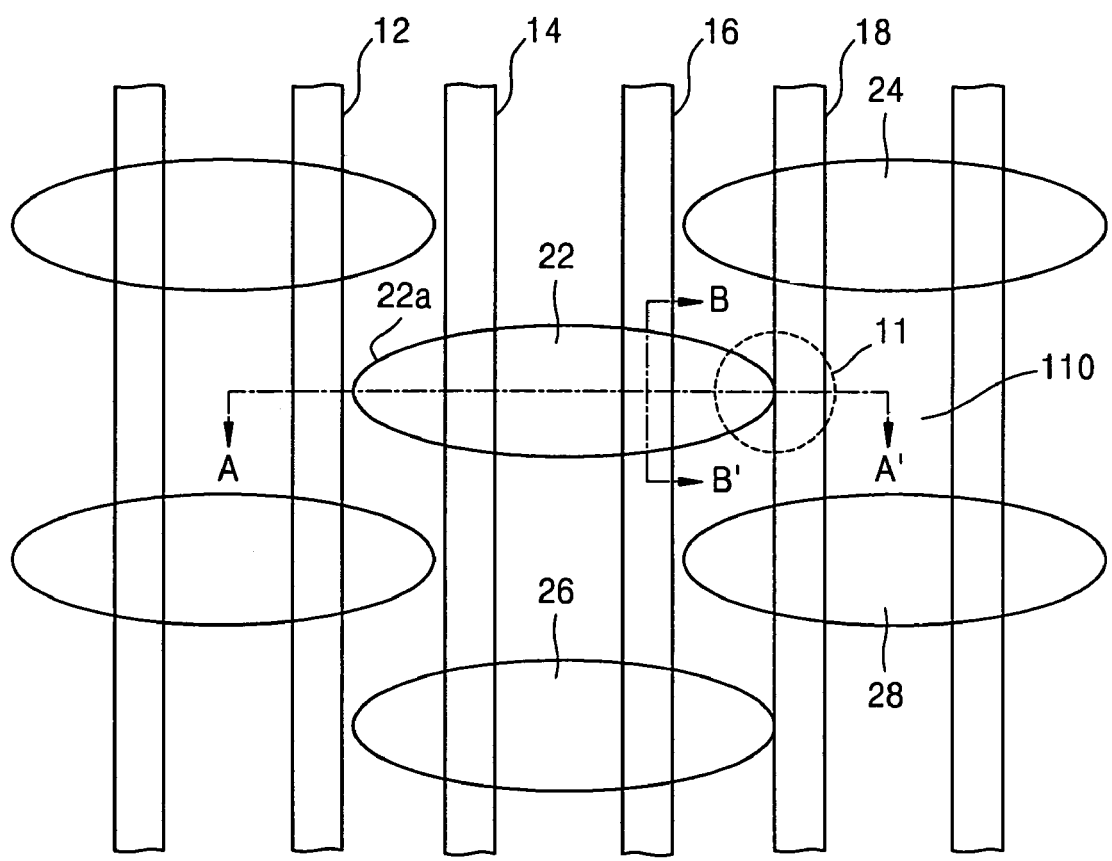
FIG. 1 is a layout showing a conventional recess channel trench pattern of forming a recess channel transistor.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the present invention, the same reference characters refer to the same elements. In the drawings, thickness of layers and regions are exaggerated for clarity.

Figure 4:
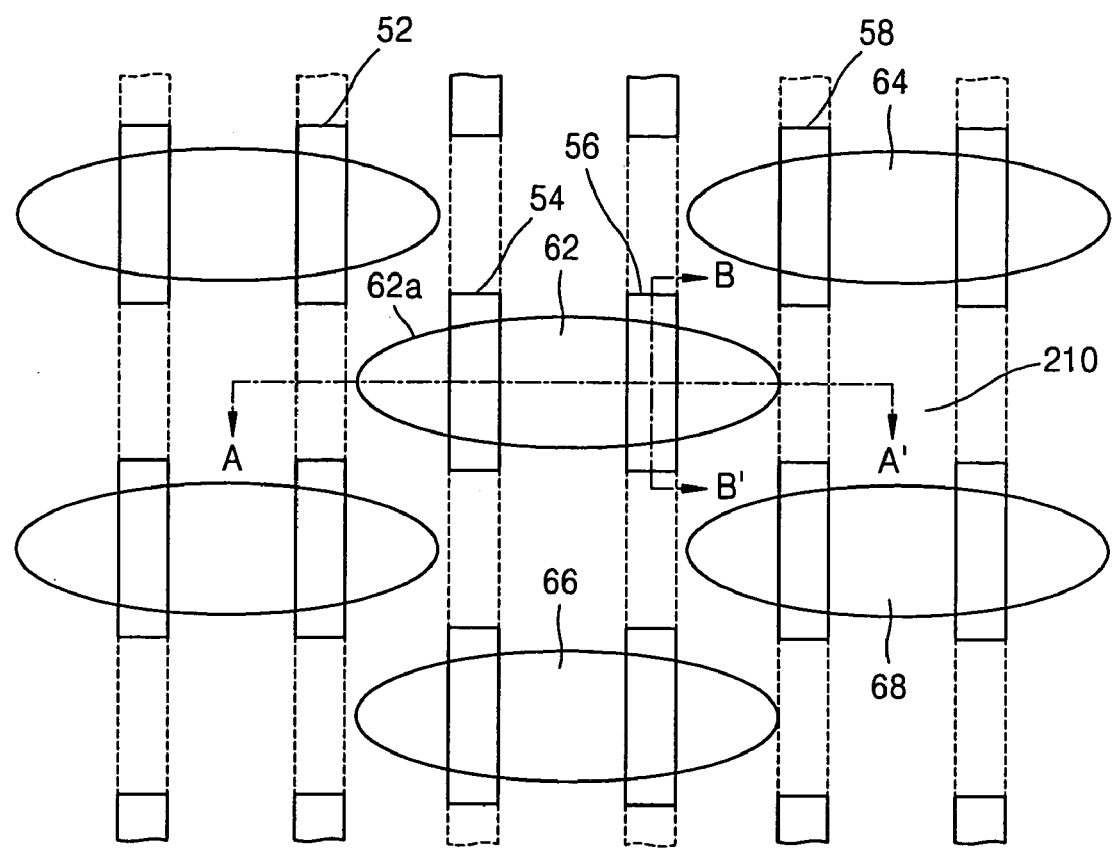
FIG. 4 is a layout showing a recess channel trench pattern formed according to one embodiment of the present invention.

FIG. 4 is a layout showing a recess channel trench pattern formed according to one embodiment of the present invention.

Referring to FIG. 4, active regions 62, 64, 66, and 68 are defined by device isolating layers with a STI structure that forms field regions 210. Different from the conventional recess channel trench pattern described with reference to FIG. 1, recess channel trenches 52, 54, 56 and 58 of the present embodiment have an isolated hole type pattern. In more detail, as shown in FIG. 4, the recess channel trenches 52, 54, 56 and 58 are formed in the active regions 62, 64, 66 and 68 and in portions of the isolating layers of adjacent field regions. Thus, the recess trench patterns are not of an extended linear shape but instead have an isolated form.

In the embodiment shown in FIG. 4, the device isolating layer in the semiconductor substrate defines groups of active regions, 62/66 and 64/68, arranged in vertical columns to compose a matrix of active regions 62, 64, 66, and 68. Active regions of adjacent groups are offset from each other, as in the figure. Intervening regions of the device isolating layer are between consecutive active regions of a group. A mask pattern of parallel linear columns that cross both the groups of active regions and the intervening regions of the device isolating layer expose the active regions within these parallel linear columns but conceal the intervening regions within the parallel linear columns in an isolated hole type pattern. In other words, the mask pattern forms columns across the substrate that expose the active regions but not the device isolating layer portion between neighboring active regions. This pattern thus forms columns comprising alternating exposed and un-exposed portions along the length of the columns.

The exposed active regions are then anisotropically etched using the mask pattern as an etch mask, thereby forming recess channel trenches 52, 54, 56, and 58 with the isolated hole type pattern.

The recess channel trenches, which will be described later, are formed by etching the semiconductor substrate of the active regions and portions of the adjacent isolating layers in such a manner that an etch selectivity of the semiconductor substrate material to the isolating layer is set as 1:1.

The recess channel trench pattern of the isolated hole type may be formed by forming photoresist patterns that expose only the inside of the isolated holes, and then by etching the exposed regions using the patterned photoresist layer as an etch mask. The isolated hole type recess channel trench pattern is formed as above, thereby inhibiting the recess channel trench 58 from intruding into the STI liner 62. Consequently, an electrical short between the recess gate and the active region can be prevented.

FIGS. 5A through 9B are sectional views showing a method of fabricating a recess channel transistor according to the first embodiment of the present invention. The line A–A' or B–B' indicated by an arrow along the bottom portion of the figures denotes the respective drawing as a sectional view taken along line A–A' or B–B' of FIG. 4.

Figure 5A:
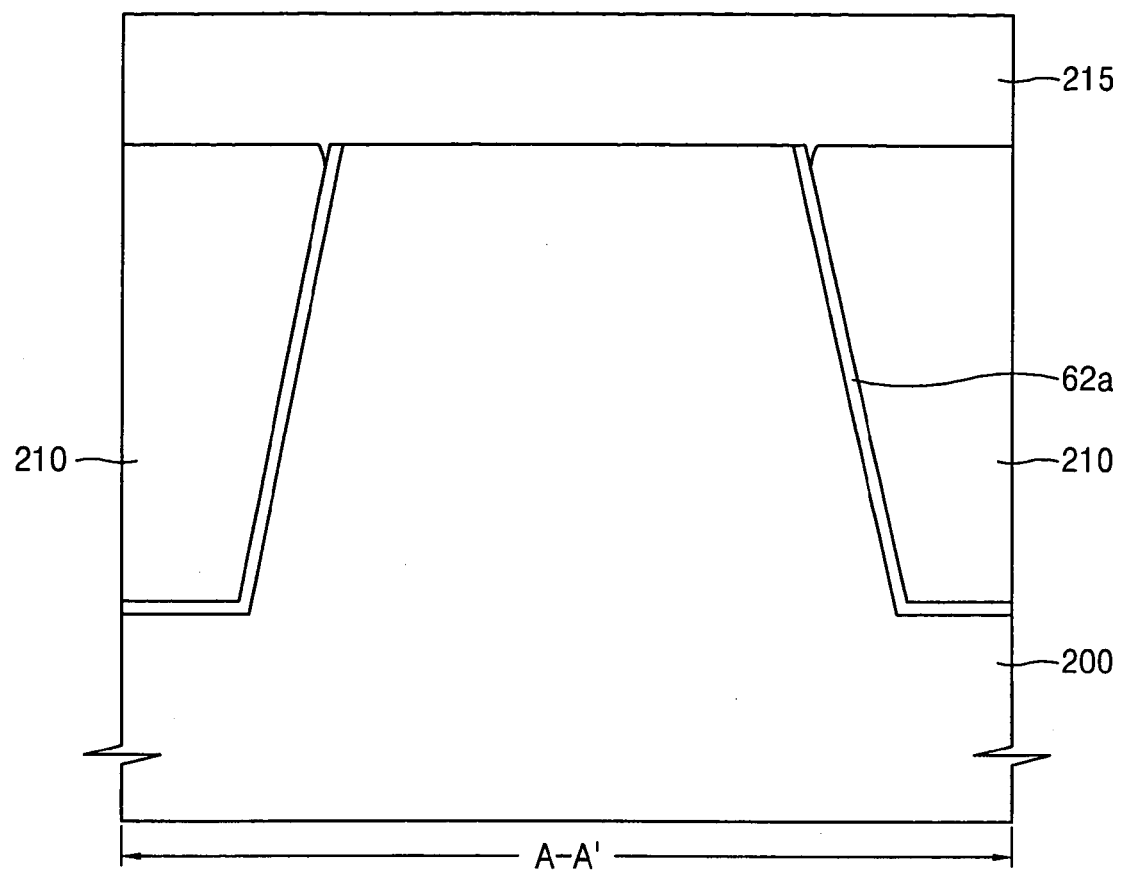
FIGS. 5A through 9B are sectional views showing a method of fabricating a recess channel transistor according to a first embodiment of the present invention.
Figure 5B:
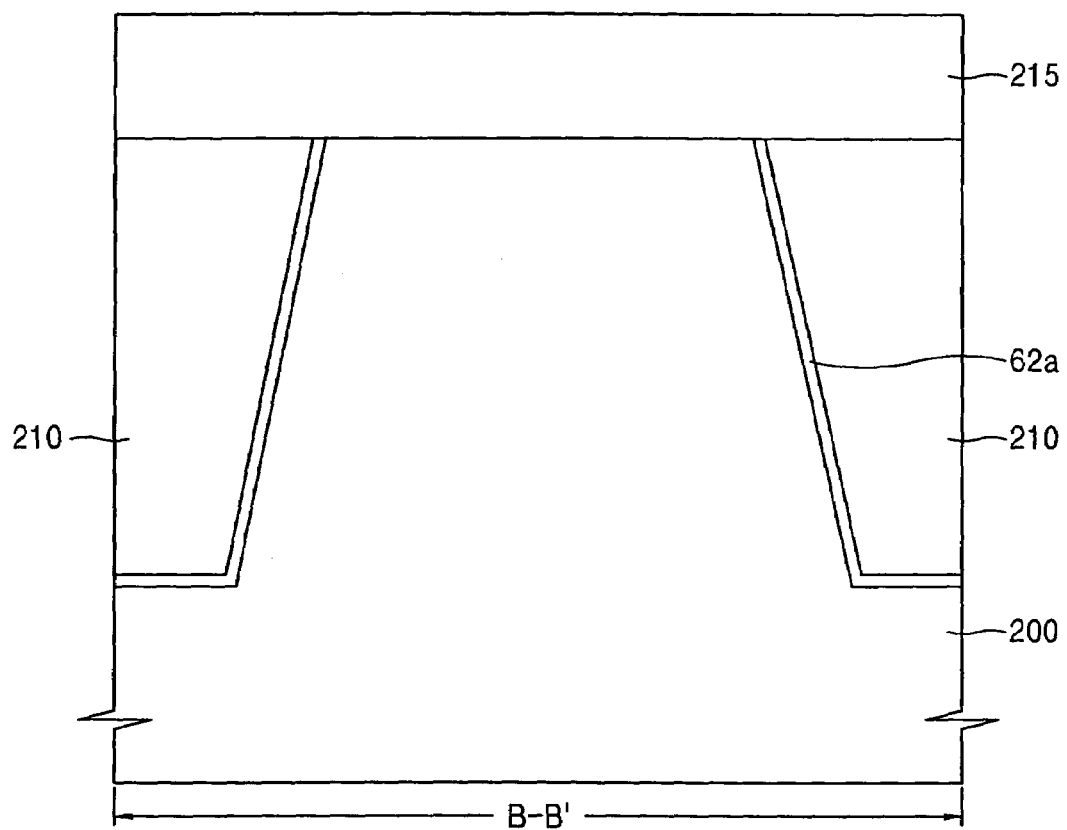

Referring to FIGS. 5A and 5B, a device isolating layer 210 with a STI structure is formed in a semiconductor substrate 200, thereby defining an active region and a field region. An impurity such as an n-type impurity with a conductivity opposite to that of the semiconductor substrate 200, is implanted to form source and drain regions (not shown) in the active region. A mask layer 215 is coated on the entire surface of the semiconductor substrate 200 including the device isolating layer 210. The mask layer 215 may be a photoresist layer or a hard mask layer such as a silicon nitride layer. When forming the device isolating layer 210, a STI liner 62a obtained by stacking thin silicon oxide/silicon nitride/silicon oxide is formed on the interface of the device isolating layer 210 and the active region. The STI liner 62a protects the isolating layer 210.

Figure 6A:
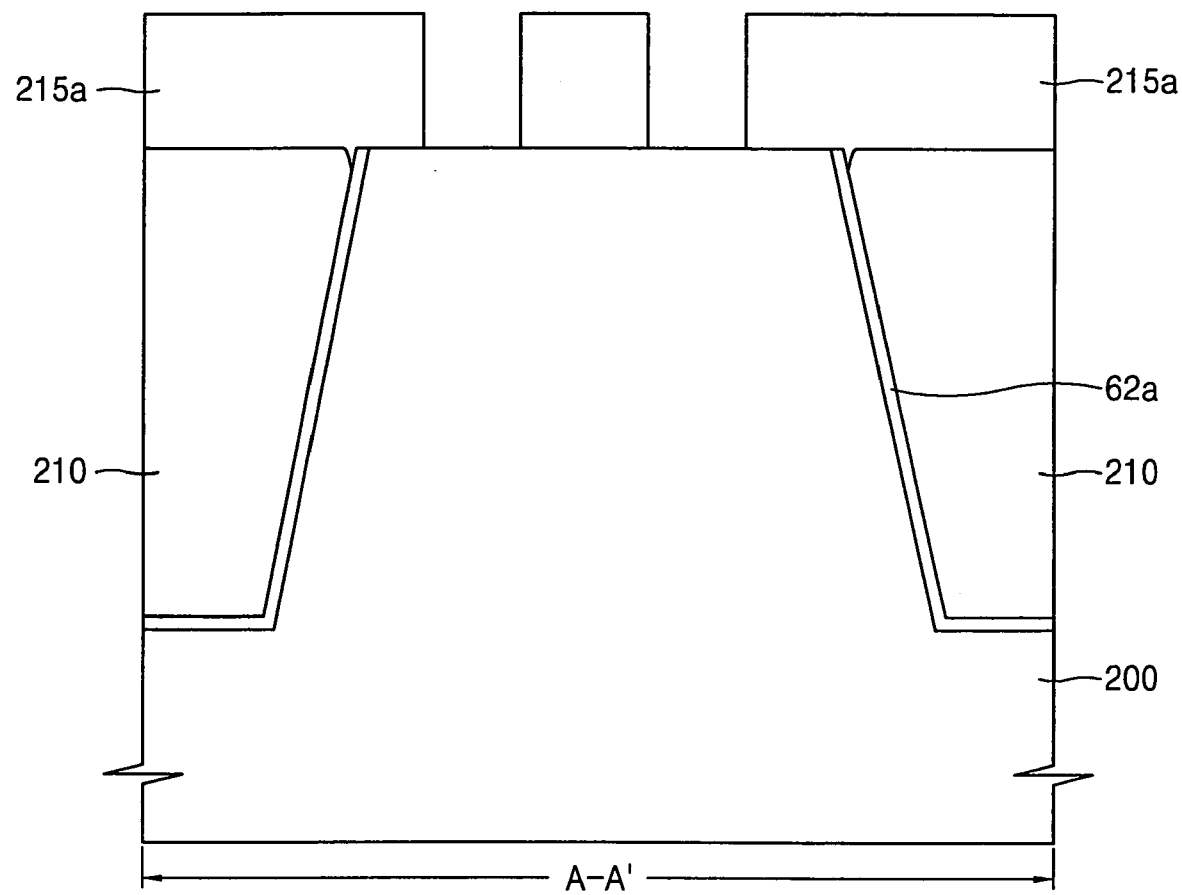
Figure 6B:
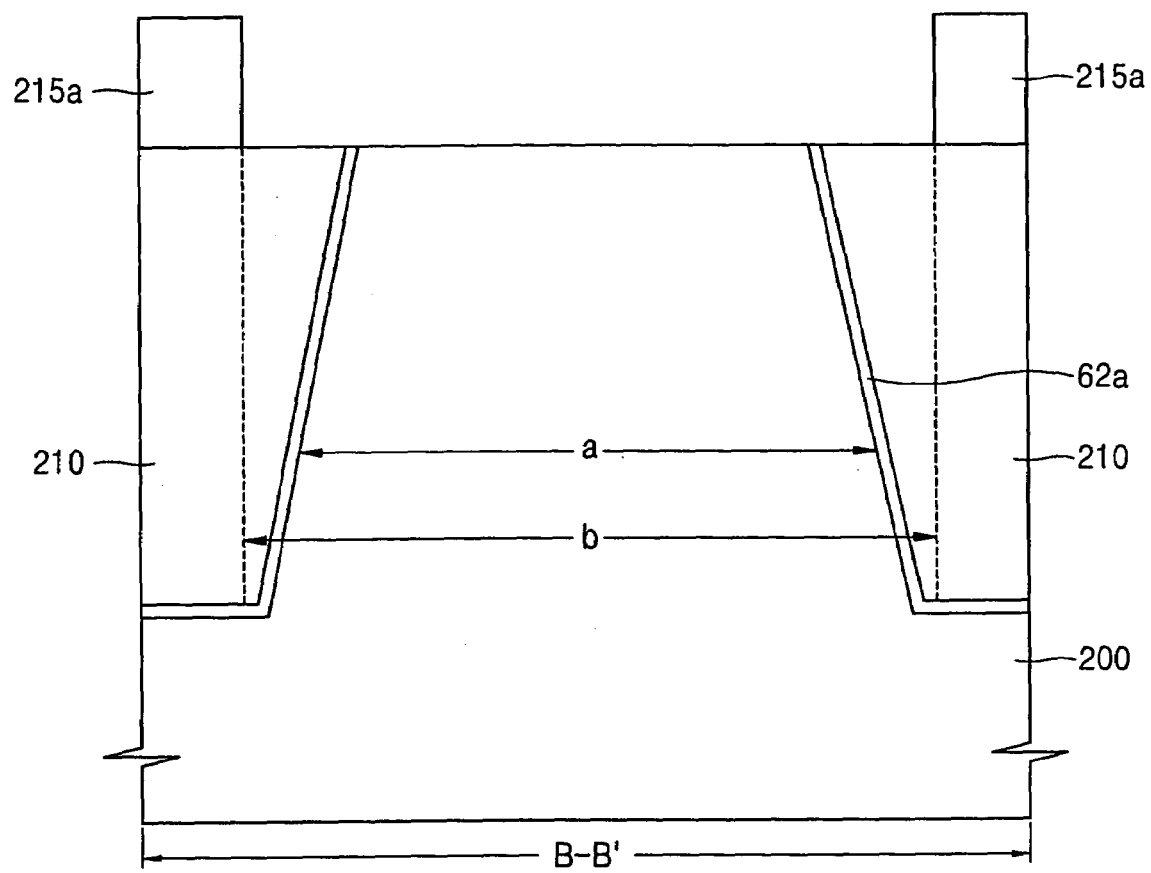

Referring to FIGS. 6A and 6B, the mask layer 215 is patterned to form an isolated hole type mask layer pattern 215a that defines a recess channel trench. If the mask layer 215 is formed of a hard mask layer such as a silicon nitride layer, the mask layer 215 is etched using the pattern of the photoresist layer formed on the mask layer 215, thereby forming the mask layer pattern 215a. However, when the mask layer 215 is formed of the photoresist layer, the mask layer pattern 215a may be formed via typical exposing and developing.

As shown in FIG. 6A, when viewed from a section cut along line A–A' of FIG. 4, the mask layer pattern 215a is formed so the device isolating layer 210 is not exposed. Referring to FIG. 6B, when viewed from a section cut along line B–B' of FIG. 4, the mask layer pattern 215a is formed to expose the semiconductor substrate 200 of the active region and a portion of the device isolating layer adjacent to the active region. At this time, the width b exposed by the mask layer pattern 215a is larger than the width a defined by the device isolating layer 210 at the depth of bottom of the recess channel trench that will be formed later.

Figure 7A:
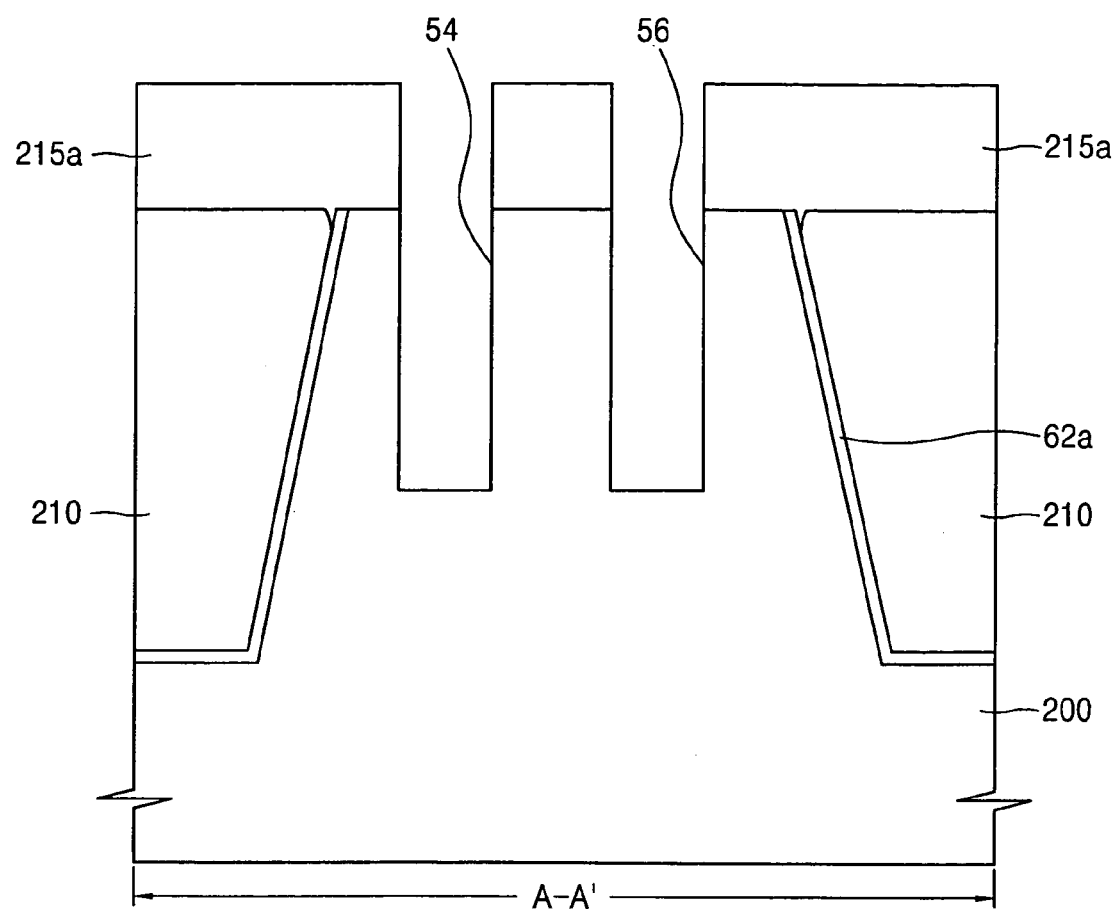
Figure 7B:
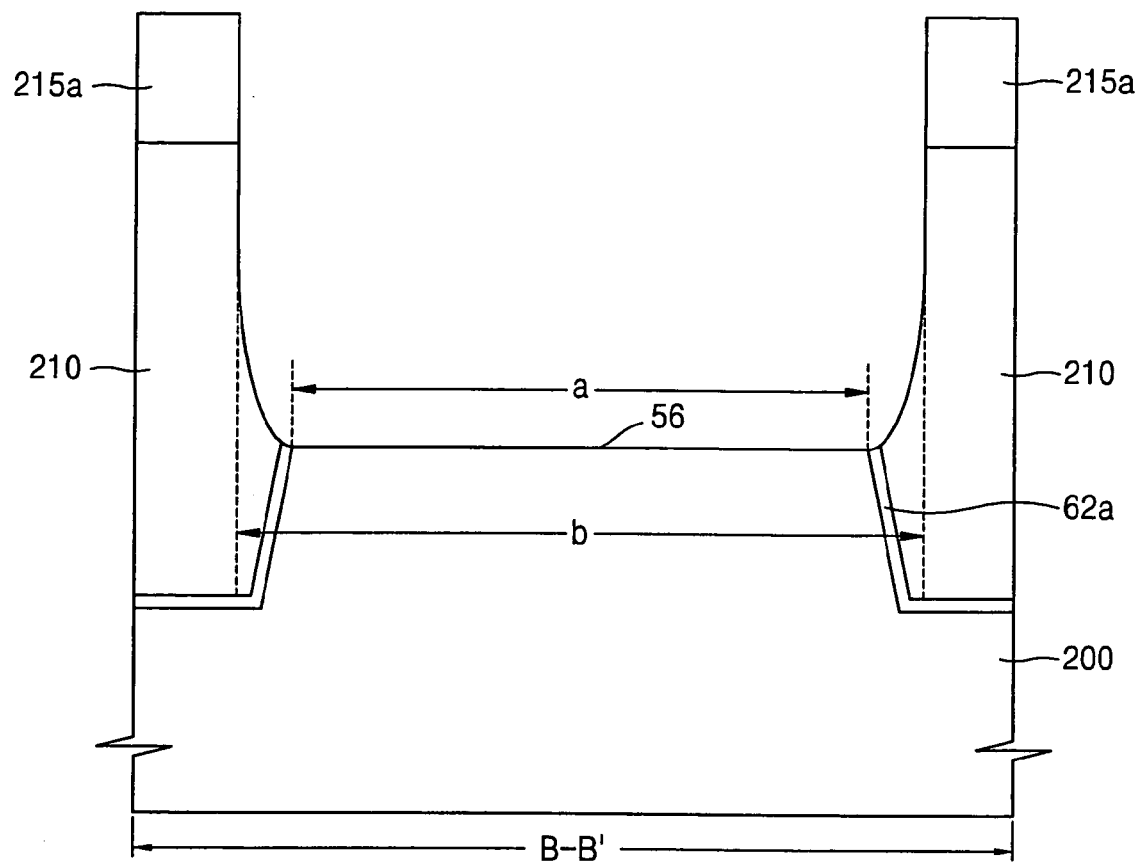

Referring to FIGS. 7A and 7B, using the mask layer pattern 215a as an etch mask, exposed semiconductor substrate 200 and the portion of the device isolating layer 210 are anisotropically etched, thereby forming recess channel trenches 54 and 56. At this time, preferable anisotropic etching may be Reactive Ion Etching (RIE). The recess channel trenches 54 and 56 are formed to be deeper than the junction depth of the source and drain regions (not shown). Here, an etch selectivity of the semiconductor substrate 200 material to the device isolating layer 210 has a relation of 1:1. Accordingly, as shown in FIG. 7B, two materials are etched with no selectivity between the semiconductor substrate 200 and the device isolating layer 210. Therefore, both materials have almost no difference in regard to the etched amounts. At this time, the width b of the recess channel trench in the gate line direction (direction of line B–B') at the level of the semiconductor substrate surface is larger than the width a line defined by the device isolating layer 210 at the bottom depth of the recess channel trench 56.

Figure 2A:
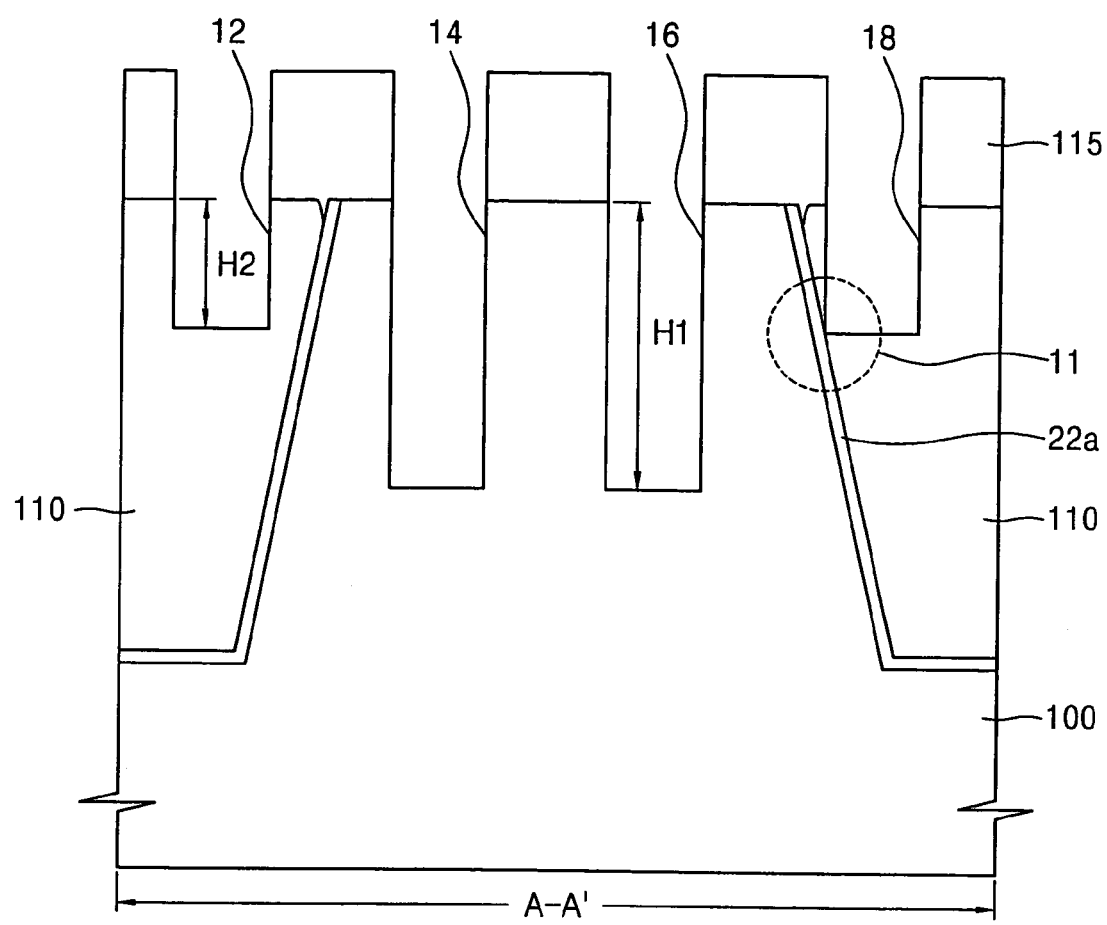
FIGS. 2A and 2B are sectional views respectively taken along lines A–A' and B–B' of FIG. 1.

As shown in FIG. 7A, when viewed from the section taken along line A–A' of FIG. 4, no recess channel trench indicated by the reference numeral 18 of FIG. 2A intrudes into the active region or the STI liner 62a in the present embodiment. This differs from the situation created by the pattern of the recess channel trench of FIG. 2A. Consequently, an increased misalign margin between the recess gate and the active region can be realized.

Figure 2B:
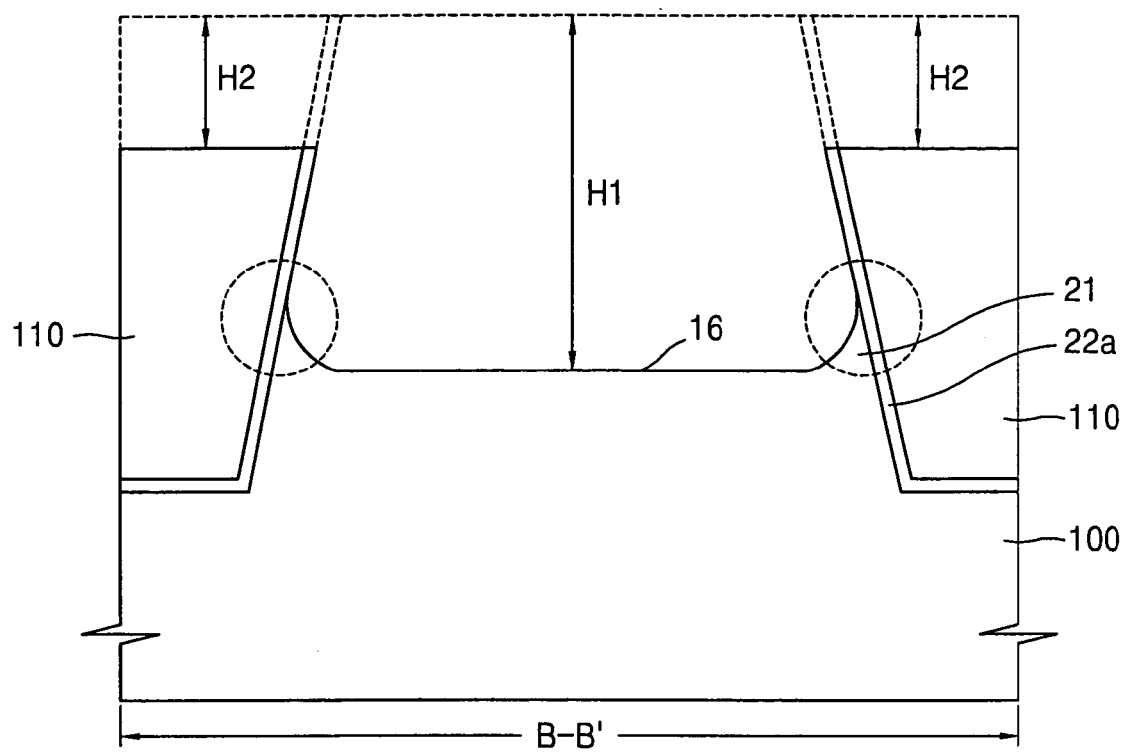
Figure 3A:
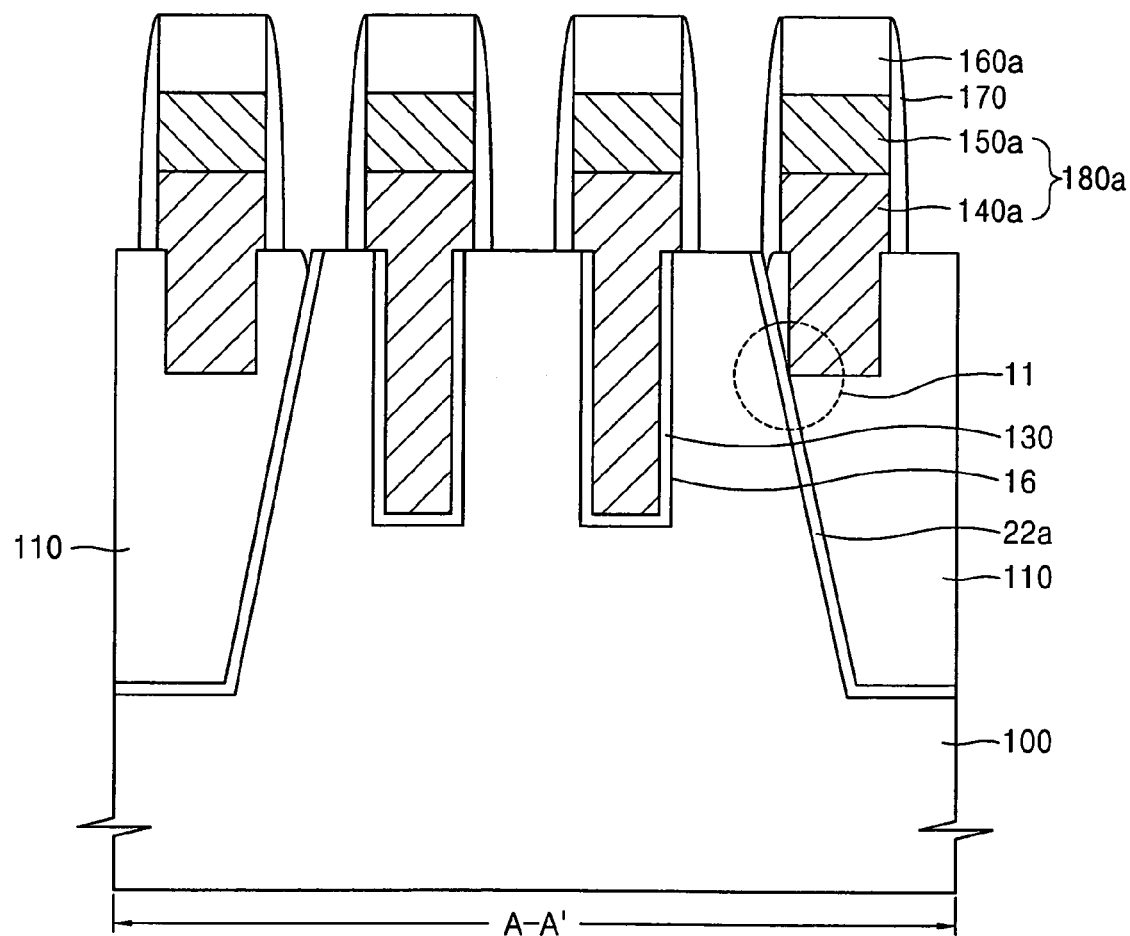

Referring to FIG. 7B, a bottom surface of the recess channel trench 56 defined by the device isolating layer 210 has a substantially flat planar shape. In other words, no residual substrate areas (refer to the reference numeral 21 of FIG. 2B) are formed on either of the bottom sides of the recess channel trench 56. Therefore, the length of the channel is not diminished between the two bottom sides of the recess channel transistor due to any residual substrate areas. Thus characteristics of the recess channel transistor are not diminished, such as a decrease of a threshold voltage, and the like.

Figure 8A:
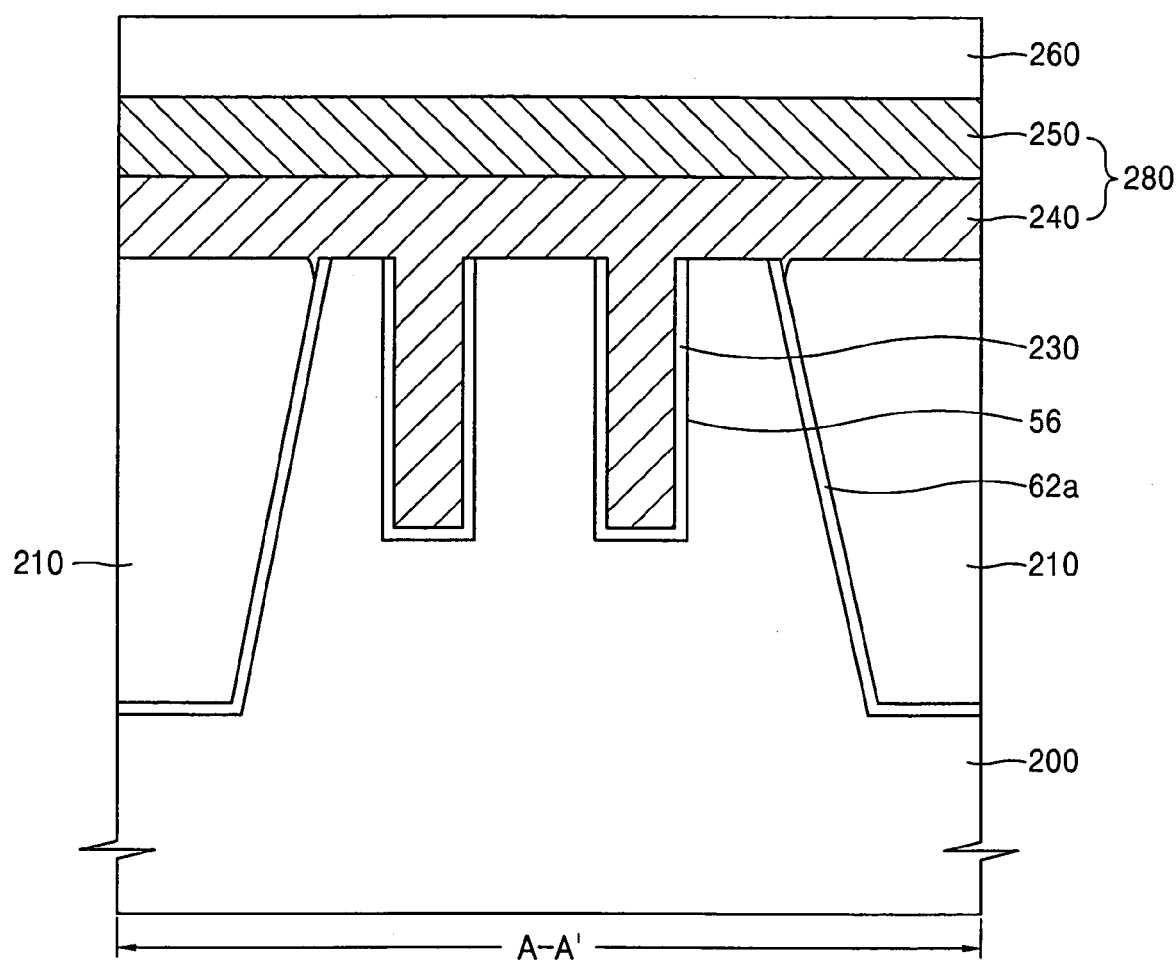
Figure 8B:
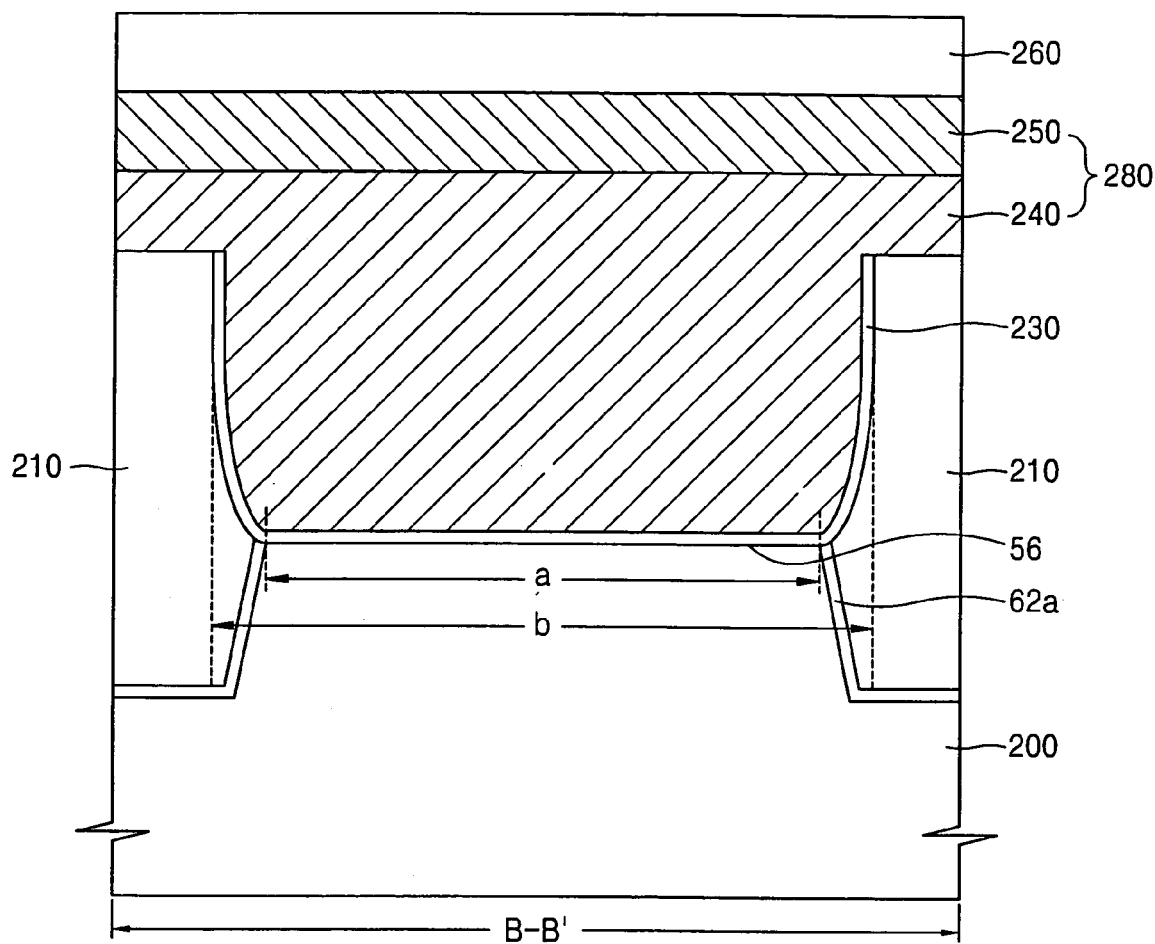

Referring to FIGS. 8A and 8B, a gate insulating layer 230 is formed along the inner wall of the recess channel trench 56. Then, a polysilicon layer 240 for filling the recess channel trench 56, a gate metal layer 250 such as WSi, and a capping layer 260 are sequentially stacked. Here, the polysilicon layer 240 and the gate metal layer 250 form a gate conductive layer 280.

Figure 9A:
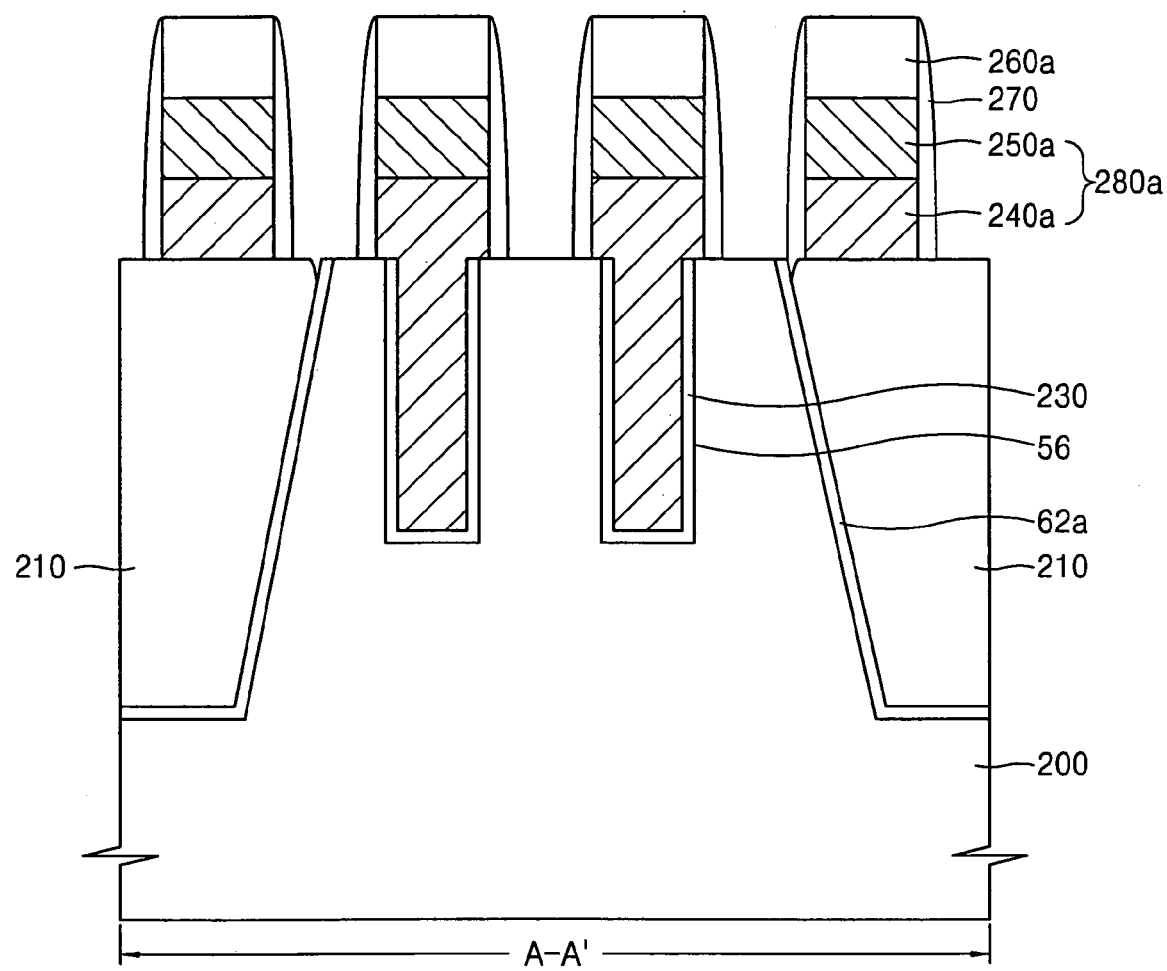
Figure 9B:
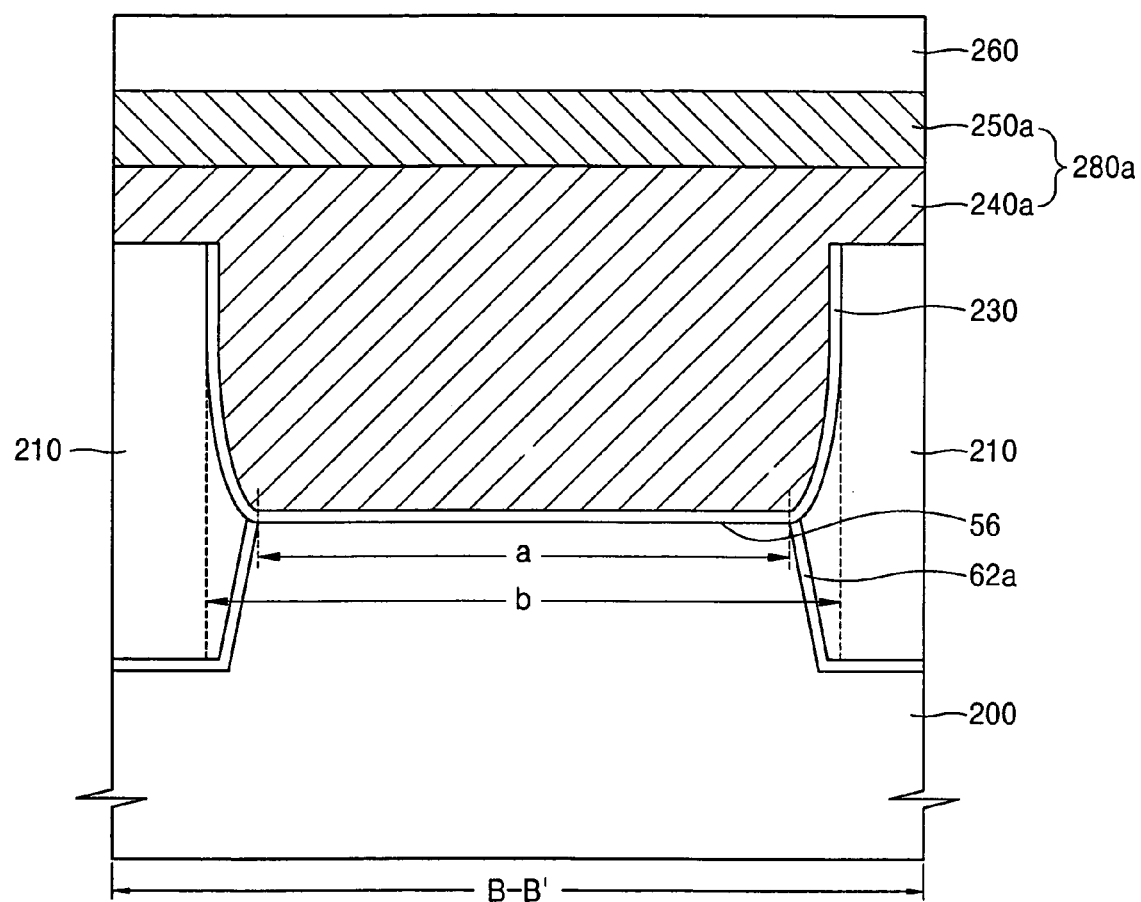

Referring to FIGS. 9A and 9B, the gate conductive layer 280 and the capping layer 260 are patterned and etched until the semiconductor substrate 200 is exposed, so that a recess gate including a polysilicon layer 240a, a gate metal layer 250a and a capping layer 260a is formed. Thereafter, spacers 270 surrounding both sidewalls of the recess gate are formed.

In the recess channel transistor fabricated as above, the recess channel trench in the field region does not intrude into the active region, thereby preventing a short between the recess gate and the active region. Moreover, the bottom surface of the recess gate is substantially flat with no residual substrate areas. Therefore, a sufficient length of a channel can be realized between both bottom sides of the recess gate.

Figure 10:
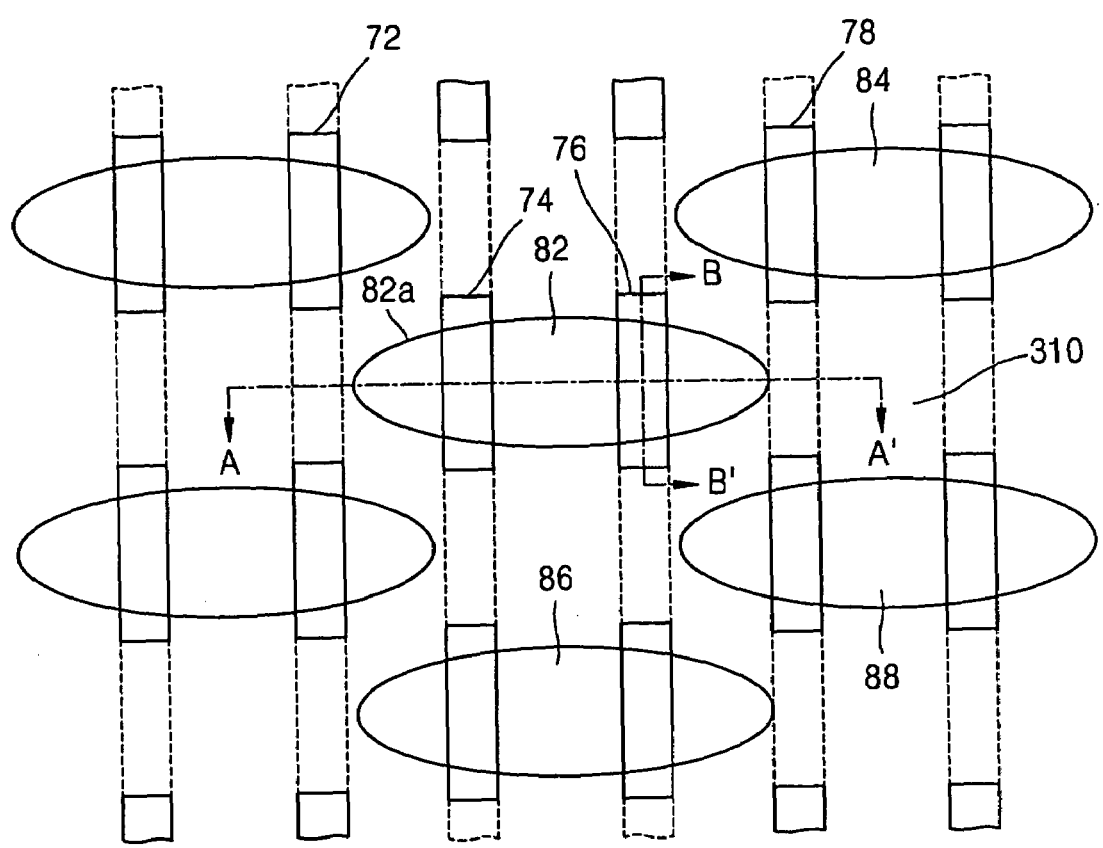
FIG. 10 is a layout showing a recess channel trench pattern formed according to another embodiment of the present invention.

FIG. 10 is a layout showing a recess channel trench pattern formed according to another embodiment of the present invention. Referring to FIG. 10, active regions 82, 84, 86 and 88 are defined by device isolating layers with the STI structure that form field regions 310. Similar to the recess channel trench of FIG. 4, the pattern of the recess channel trench shown in FIG. 10 forms an isolated hole type pattern. However, recess channel trenches 72, 74, 76 and 78 of FIG. 10 are formed by etching a semiconductor substrate and a portion of an adjacent insulating layer, in which an etch selectivity of the semiconductor substrate to the isolating layer is set to greater than 1:1. Thus, as will be described later, the isolating layer portion and the active region are stepped at the depth of the trench.

FIGS. 11A through 14B are sectional views showing a method of fabricating a recess channel transistor according to the second embodiment of the present invention using the layout as shown in FIG. 10. Lines A–A' and B–B' designated in the bottom portion of the respective drawings indicate the respective sectional view taken along either lines A–A' or B–B'.

Figure 11A:
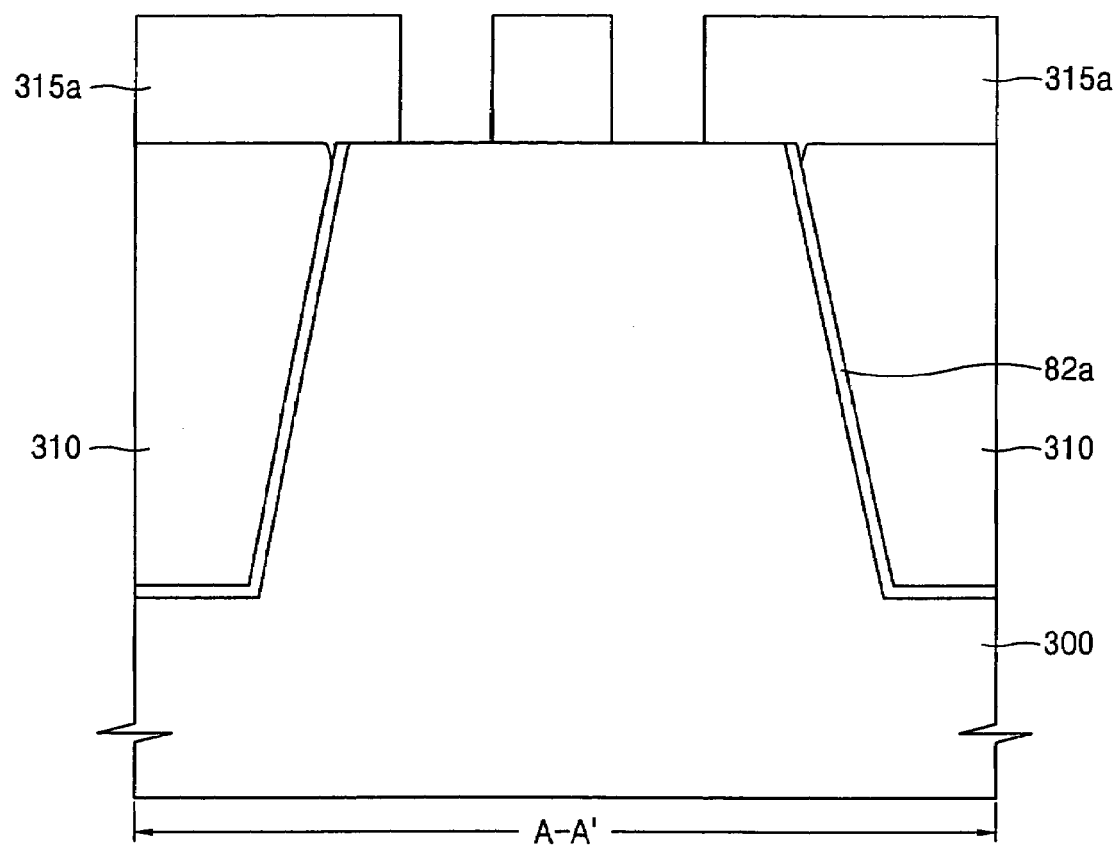
FIGS. 11A through 14B are sectional views showing a method of fabricating a recess channel transistor according to a second embodiment of the present invention.
Figure 11B:
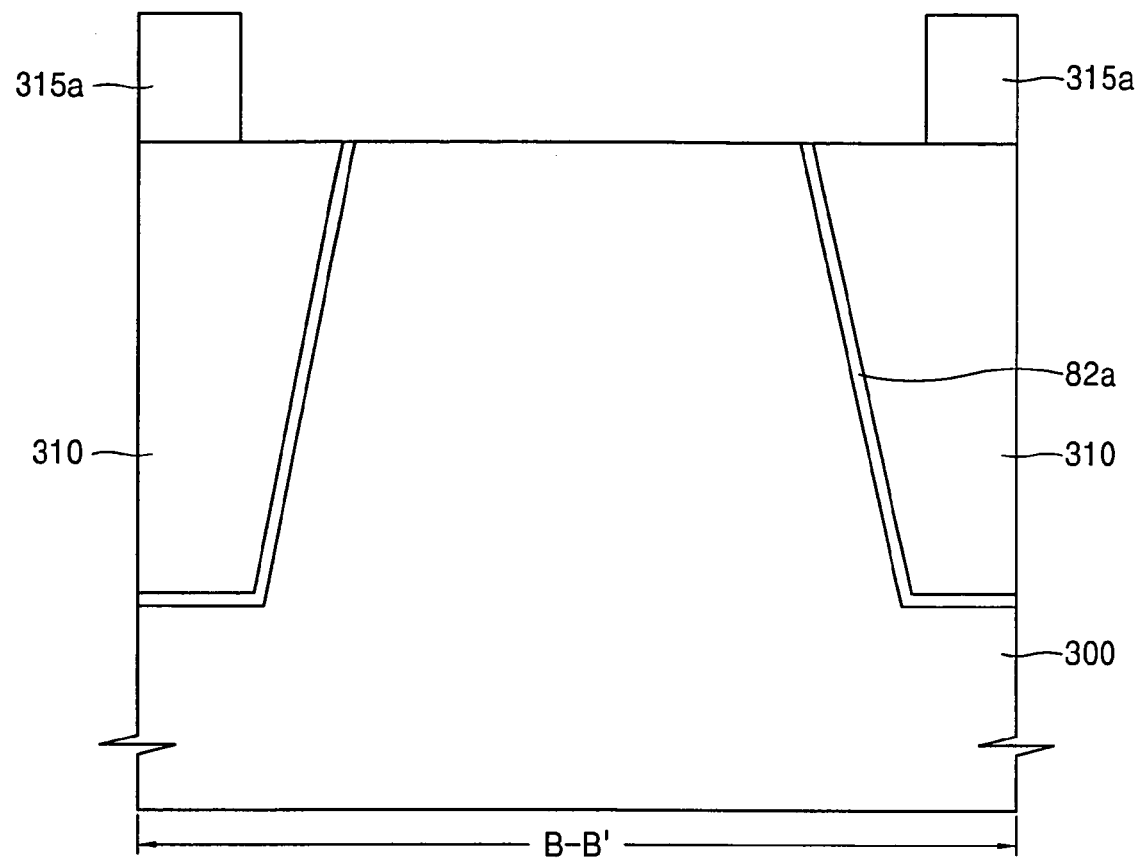

Referring to FIGS. 11A and 11B, a mask layer pattern 315a is formed on a semiconductor substrate 300 formed with a device isolating layer 310 and source and drain regions (not shown) similar to those described with reference to FIGS. 6A and 6B. The mask layer pattern 315a is the isolated hole type as shown in FIG. 10. Accordingly, as shown in FIG. 11A when viewed from a section taken along line A–A' of FIG. 10, the mask layer 315a is formed so the device isolating layer 310 is not exposed. Also, as shown in FIG. 11B when viewed from the section taken along line B–B' of FIG. 10, the mask layer pattern 315a exposes the semiconductor substrate 300 of the active region and a portion of the adjacent device isolating layer 310.

Figure 12A:
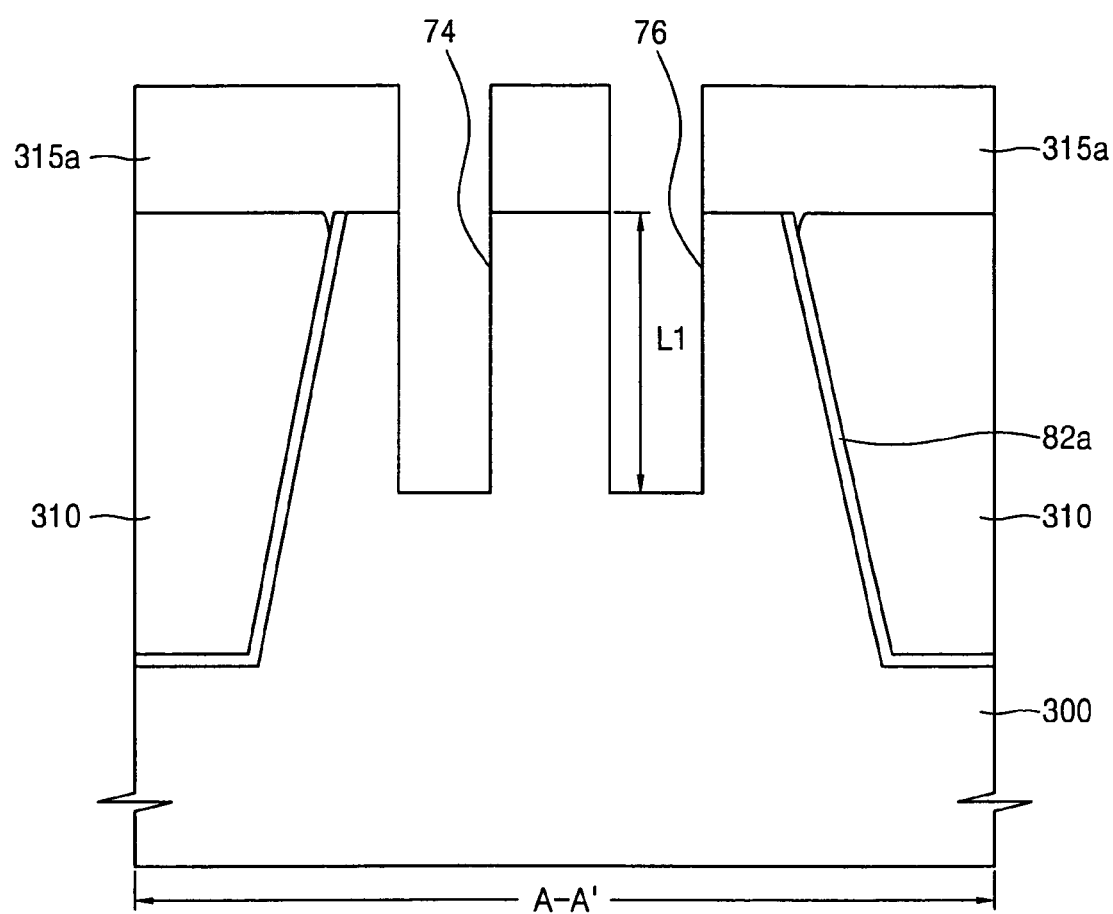
Figure 12B:
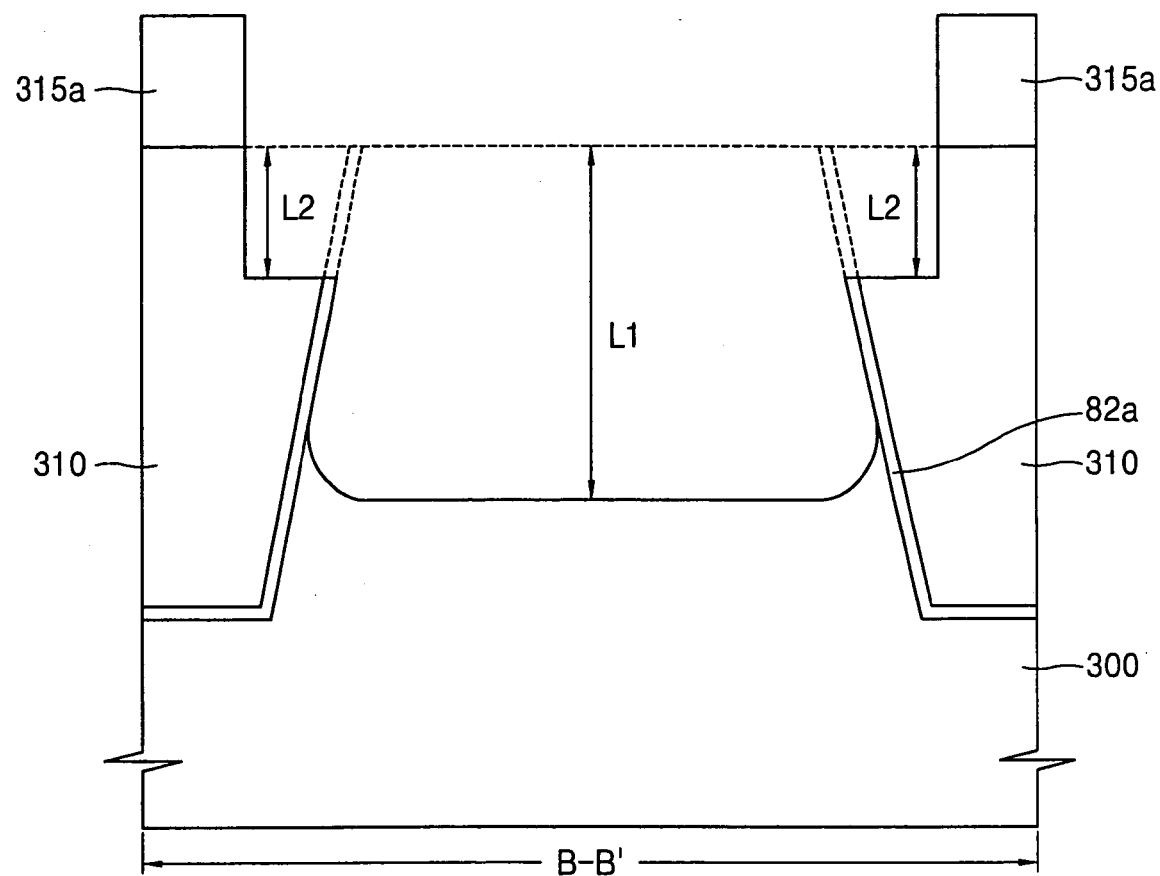

Referring to FIGS. 12A and 12B, using the mask layer pattern 315a as an etch mask, exposed semiconductor substrate 300 and device isolating layer 310 are anisotropically etched by RIE, thereby forming recess channel trenches 74 and 76. At this time, an etch selectivity of the semiconductor substrate 300 material to the isolating layer 310 is set to be larger than 1:1. For example, the etch selectivity of the semiconductor substrate 300 material to the device isolating layer 310 may be 6:1 or greater. Therefore, as shown in FIG. 12B, the isolating layer 310 and the semiconductor substrate 300 are stepped due to a difference in the etched depths. That is, while the device isolating layer 310 exposed by the mask layer pattern 315a is etched to a depth L2, the semiconductor substrate 300 material is etched to a depth L1 that is 6 times deeper than the depth L2.

Referring to FIG. 12A, when viewed from the section taken along line A–A', no recess channel trench is formed in the device isolating layer 310 that forms the field region. Thus, the present embodiment, as in the cases of the other embodiments of the present invention, involves no intrusion of the recess channel trench into the active region or the STI liner 82a. However, as shown in FIG. 12B, the residual substrate areas are formed at both bottom sides of the recess channel trench. In other words, the channel length decrease due to the residual substrate areas cannot be thoroughly avoided, but the short occurring between the recess gate and the active region due to the intrusion of the recess channel trench into the active region or the STI liner 82a can be prevented.

Figure 13A:
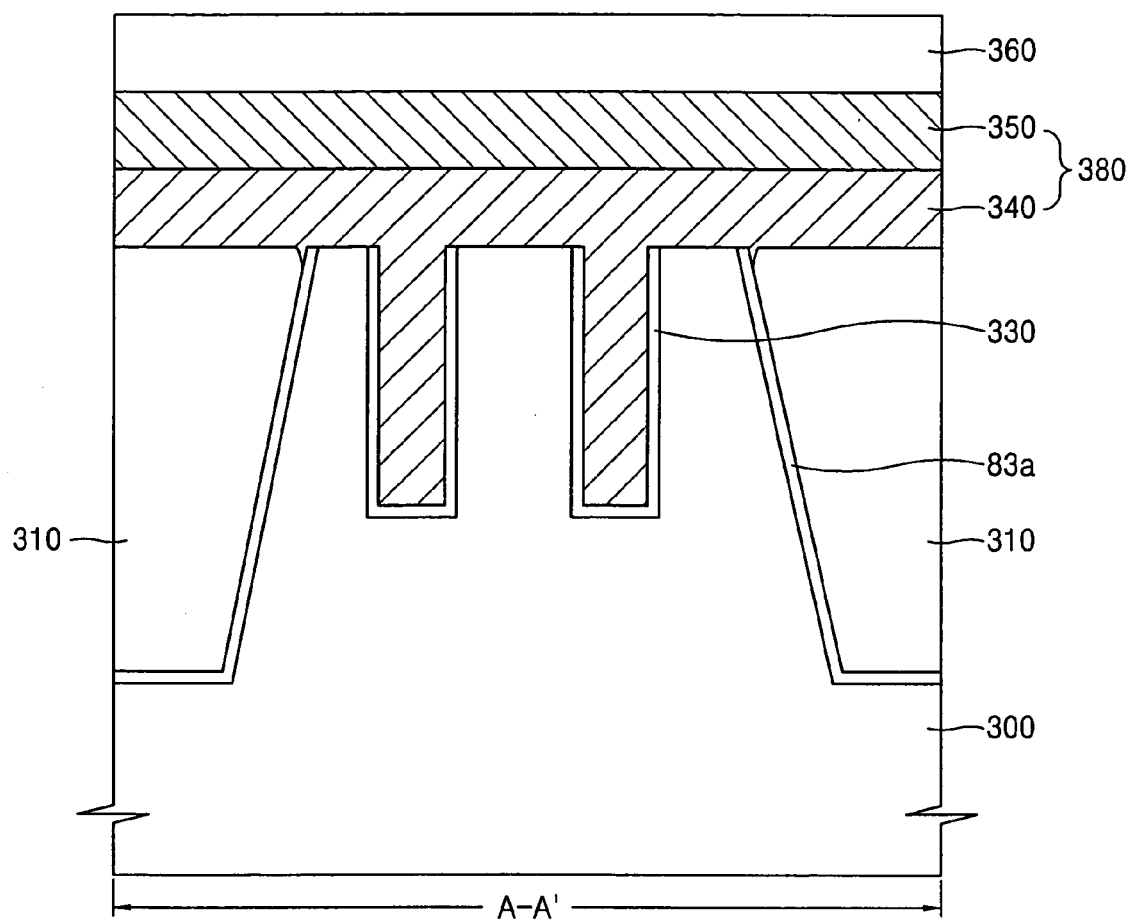
Figure 13B:
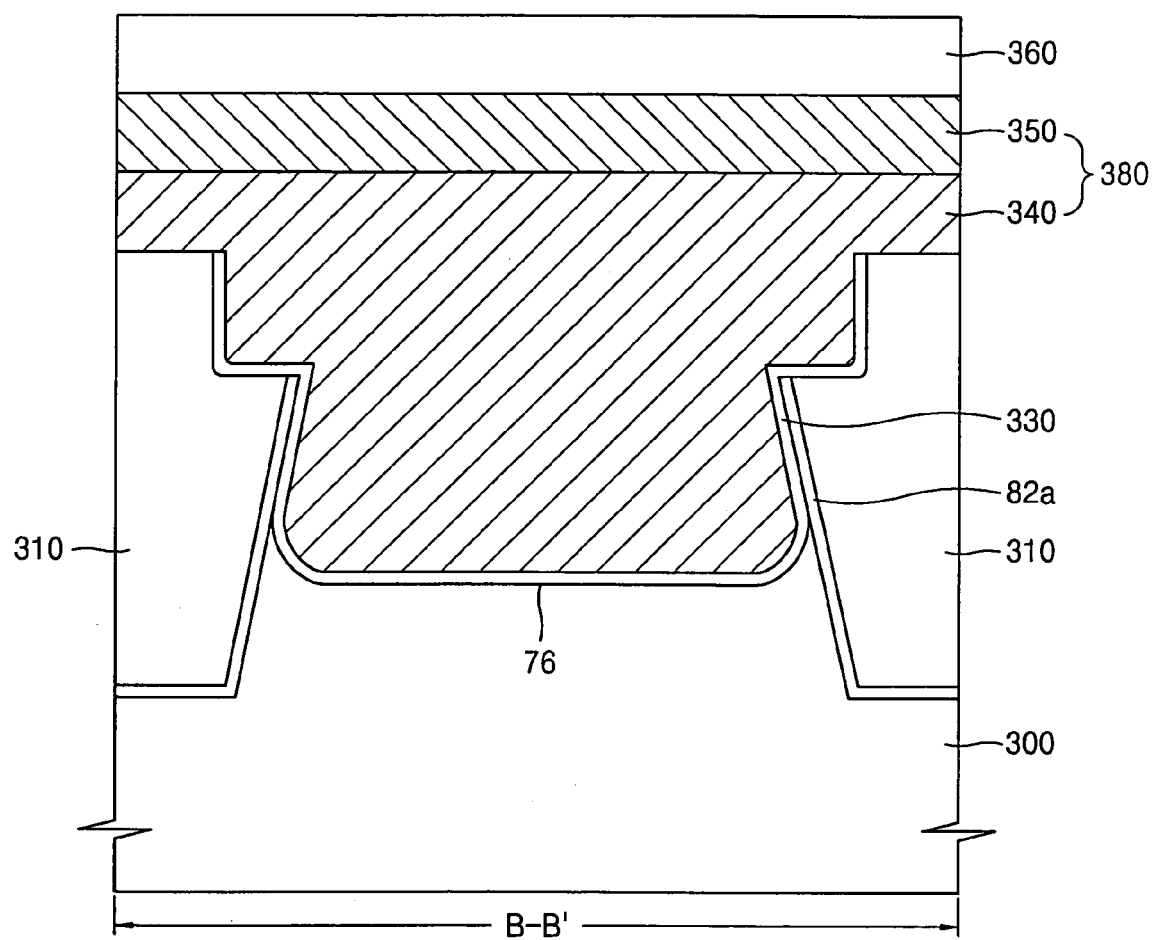

Referring to FIGS. 13A and 13B, a gate insulating layer 330 is formed along the inner walls of the recess channel trenches 74 and 76. Then, a polysilicon layer 340 for filling the recess channel trenches 74 and 76, a gate metal layer 350 such as WSi, and a capping layer 360 are sequentially stacked. At this time, the polysilicon layer 340 and the gate metal layer 350 form a gate conductive layer 380.

Figure 14A:
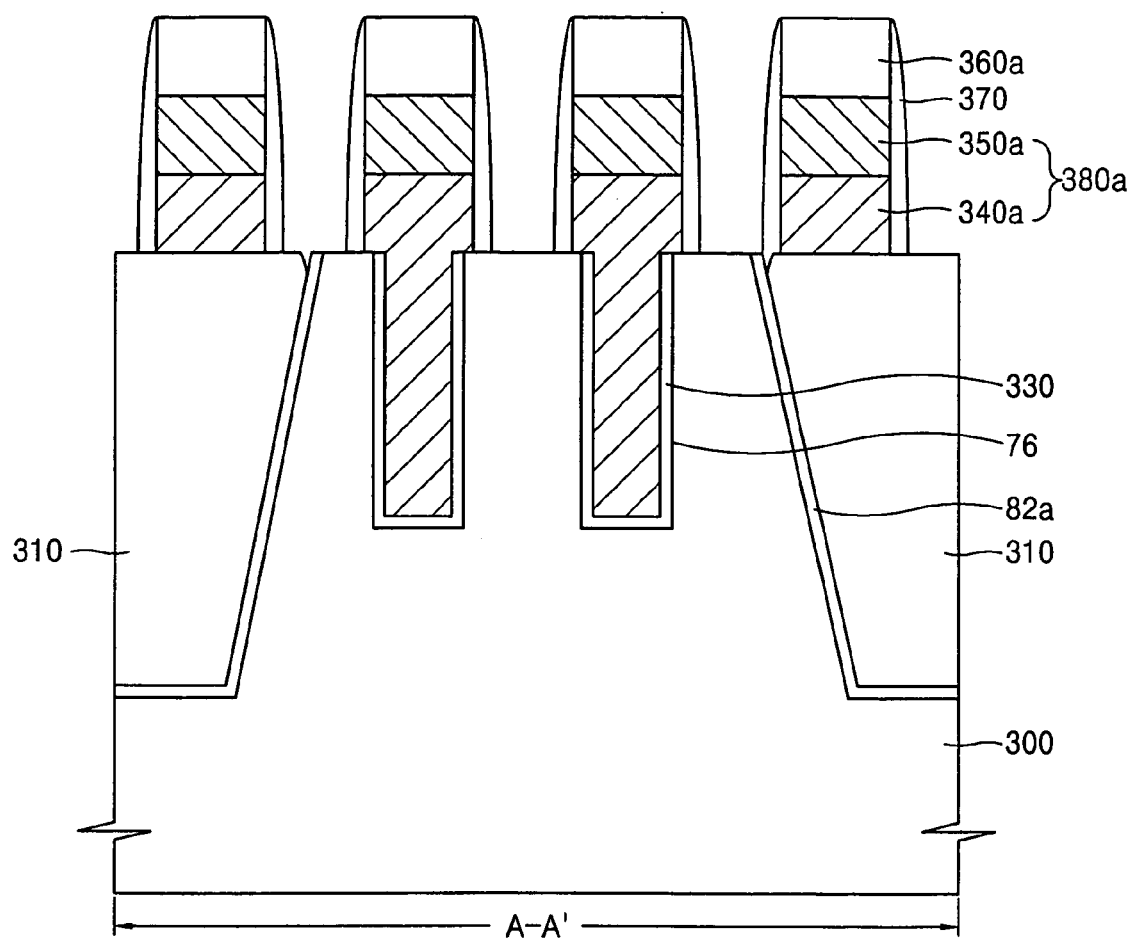
Figure 14B:
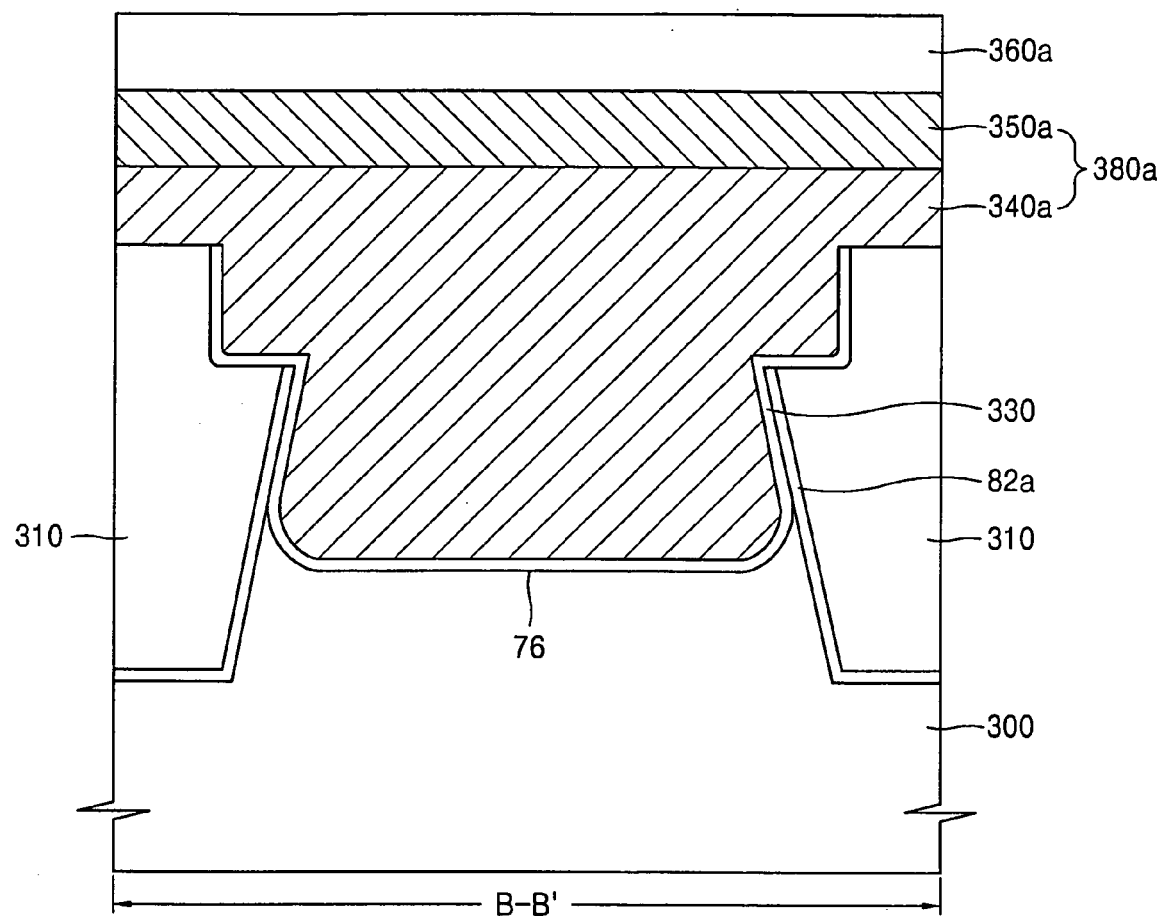

Referring to FIGS. 14A and 14B, the gate conductive layer 380 and the capping layer 360 are patterned and etched until the semiconductor substrate 300 is exposed, thereby forming a recess gate that includes a polysilicon layer 340a, a gate metal layer 350a and a capping layer 360a. Thereafter, spacers 370 are formed by surrounding both sidewalls of the recess gate.

In the recess channel transistor fabricated as above, the recess channel trench in the field region neither intrude into the active region or STI liner nor result in a short or interference between the recess channel gate and the active region. Therefore, a greater misalign margin can be realized between the recess gate and the active region.

Figure 15:
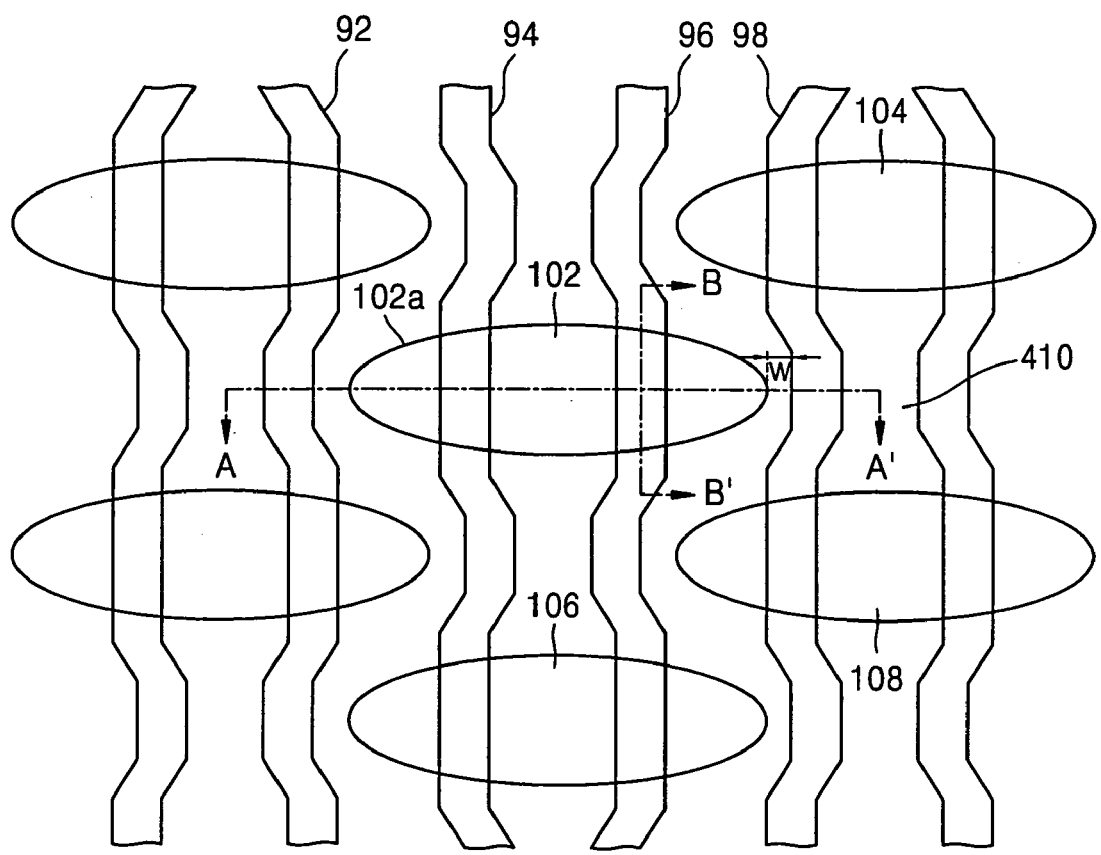
FIG. 15 is a layout showing a recess channel trench pattern formed according to still another embodiment of the present invention.

FIG. 15 is a layout showing a recess channel trench pattern formed according to still another embodiment of the present invention. Referring to FIG. 15, active regions 102, 104, 106 and 108 are defined by the device isolating layers with the STI structure that form field regions 410. Recess channel trench patterns 92, 94, 96 and 98 are a curved line type. More specifically, as shown in FIG. 15, a portion of the recess channel trench line in the field region is curved, being spaced apart from the adjacent active region. Accordingly, the recess channel trench 98 in the field region is spaced apart from an active region 102 adjacent to the field region, so that a sufficient distance of a predetermined width W is achieved. Therefore, intrusion of the recess channel trench 98 into the active region 102 or the STI liner 102a is avoided. In turn, a short occurring between the recess gate and the active region can be prevented.

FIGS. 16A through 17B are sectional views showing a method of fabricating a recess channel transistor according to the third embodiment of the present invention using the layout of FIG. 15. Lines A–A' and B–B' designated in the bottom portions of the respective drawings indicate the respective sectional view taken along either lines A–A' or B–B' of FIG. 15.

Figure 16A:
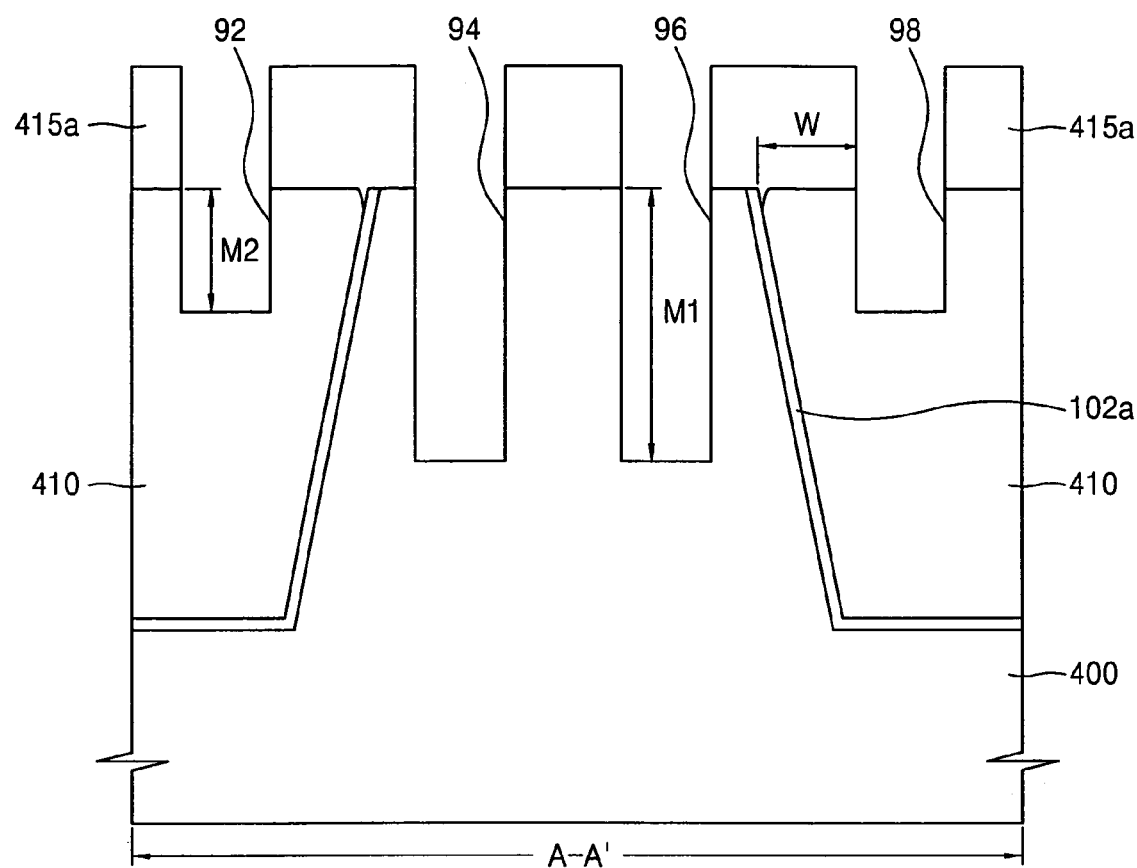
FIGS. 16A through 17B are sectional views showing a method of fabricating a recess channel transistor according to the third embodiment of the present invention.
Figure 16B:
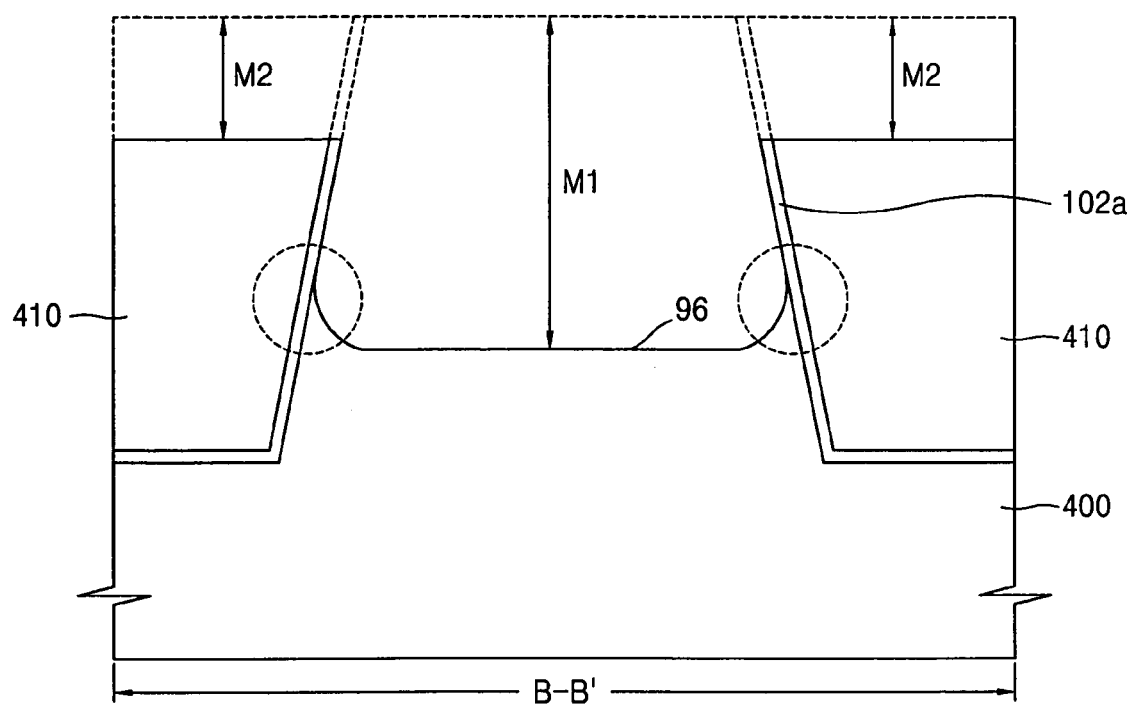

Referring to FIGS. 16A and 16B, a mask layer pattern 415a for defining a recess channel trench is formed on a semiconductor substrate 400 already formed with a device isolating layer 410, and source and drain regions (not shown). Using the mask layer pattern 415a as an etch mask, the exposed semiconductor substrate 400 and the device insulating layer 410 are anisotropically etched. At this time, an etch selectivity of the semiconductor substrate 400 material to the device isolating layer 410 is 1:1 or greater. For example, the etch selectivity may be 6:1 or greater. Since the etch selectivity of the semiconductor substrate 400 material is large, an etched depth M1 in the semiconductor substrate 400 is much greater than an etched depth M2 in the device isolating layer 410. If the etch selectivity is small, the depth M2 of the recess channel trench 98 formed in the isolating layer 400 is increased. Therefore, there is an increased possibility of intrusion of the recess channel trench 98 formed in the isolating layer 400 into the semiconductor substrate 400 of the active region or the STI liner 102a.

The mask layer pattern 415a and the recess channel trenches 92, 94, 96 and 98 defined by the mask layer pattern 415a are curved line type as shown in FIG. 15. As shown in FIG. 16A when viewed from a section taken along line A–A' of FIG. 15, the recess channel trench 98 formed in the device isolating layer 410 is spaced apart from the active region of the semiconductor substrate 400 by the predetermined width W. Consequently, intrusion of the recess channel trench 98 in the field region into the semiconductor substrate 400 of the active region through the STI liner 102a can be prevented.

Referring to FIG. 16B, residual substrate areas are formed on both bottom sides of the recess channel trench 96. The residual substrate areas are formed because the semiconductor substrate 400 and the device isolating layer 410 are etched with a large etch selectivity in the condition that the device isolating layer 410 has a positive slope (the device isolating layer widens towards the upper portion thereof). Although the formation of the residual substrate areas cannot be thoroughly blocked, the intrusion of the recess channel trench 98 in the field region into the active region or STI liner can be prevented.

Figure 17A:
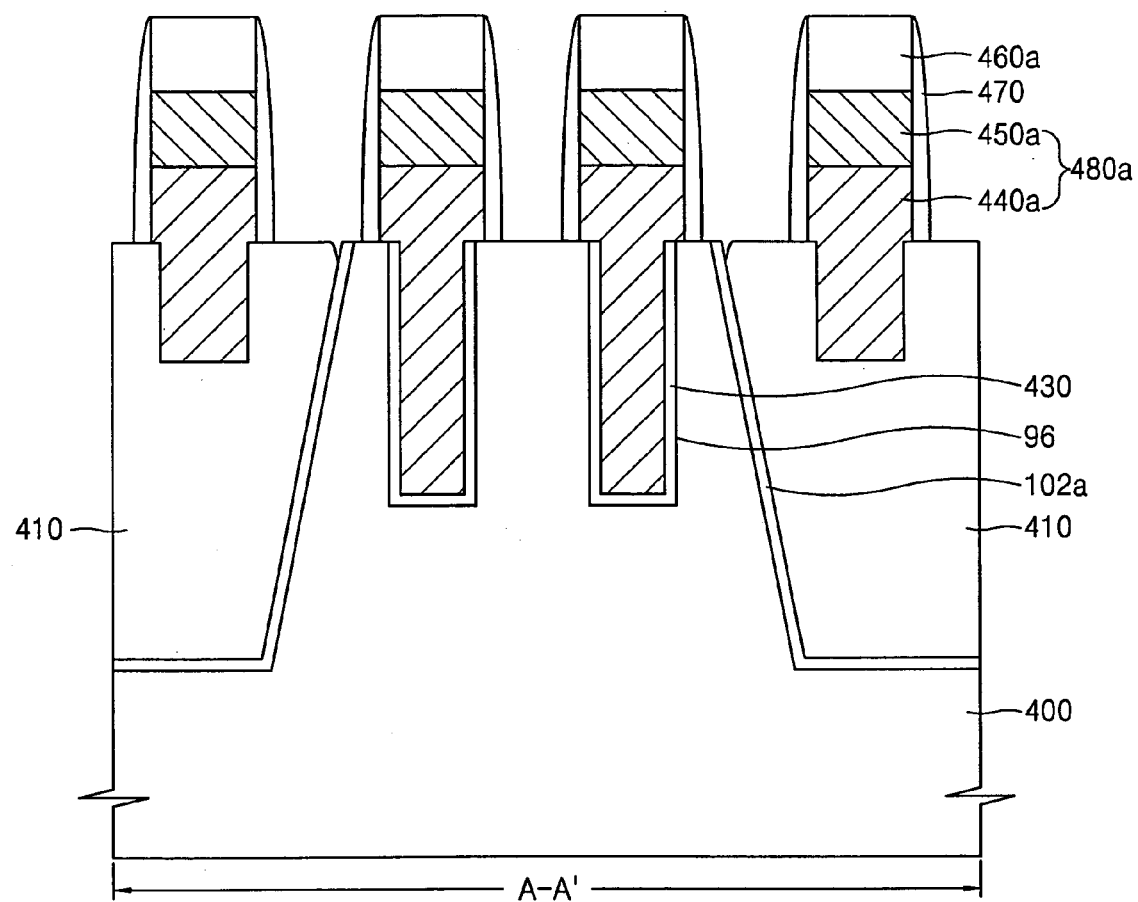
Figure 17B:
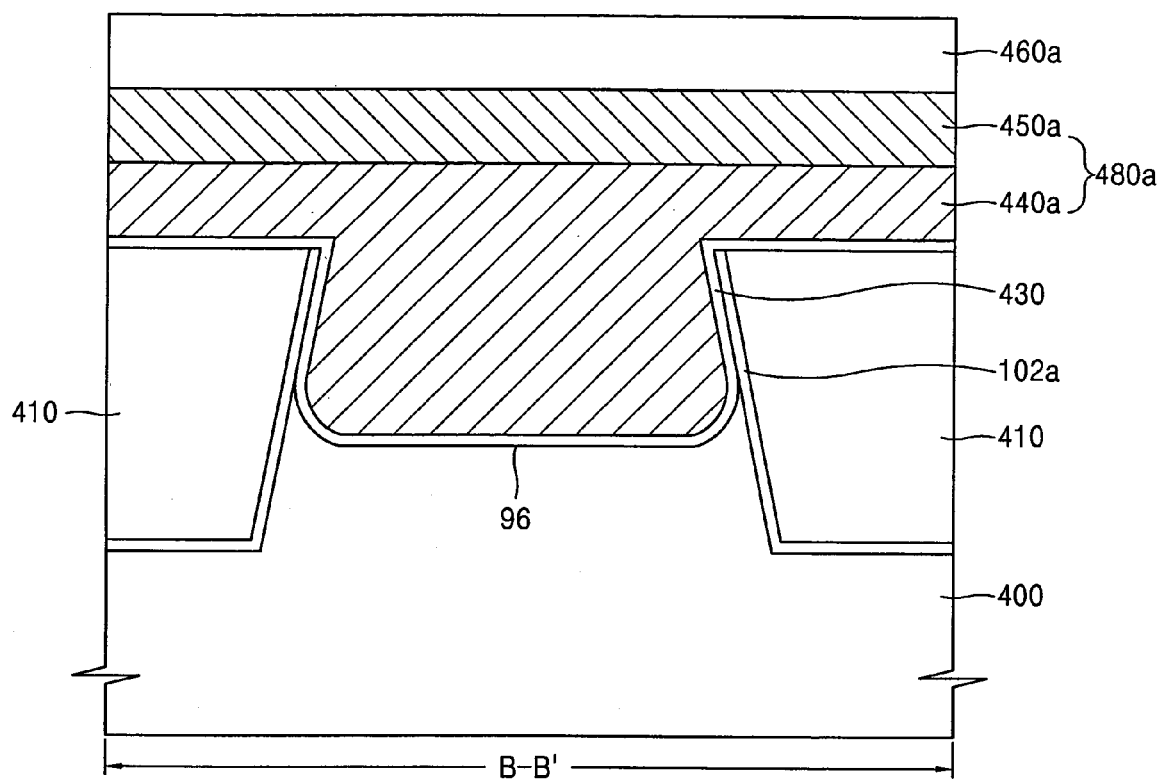

Referring to FIGS. 17A and 17B, a recess gate formed of a gate insulating layer 430, a polysilicon layer 440a, a gate metal layer 450a and a capping layer 460a is formed on the recess channel trench 96. Then, spacers 470 are formed on sidewalls of the recess gate.

In the recess channel transistor fabricated as above, the intrusion of the recess channel trench 98 in the field region into the semiconductor substrate 400 of the active region or the STI liner 102a is prevented. Thus, liability of causing a short between the gate conductive layer 480a of the recess gate and the active region of the semiconductor substrate 400 is decreased.

According to the present invention, intrusion of a recess channel trench in a field region into an active region through a STI liner can be prevented. By doing so, a short or mutual interference between a recess gate of the recess channel transistor and the active region can be prevented. Furthermore, a mask layer pattern with an isolated hole type pattern is used as an etch mask, so that a semiconductor substrate of an active region and an adjacent portion of the isolating layer are etched with a one-to-one etch ratio. Therefore, the bottom surface of the recess gate defined by the isolating layer can be substantially flat, thereby preventing the formation of residual substrate areas on both bottom sides of the recess gate. Thus, problems caused by a decreased length of channel, such as a lowered threshold voltage and increased leakage current caused by a residual substrate area, can be avoided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a recess channel trench pattern comprising:

forming a device isolating layer in a semiconductor substrate that defines an active region;

forming a mask layer on the semiconductor substrate;

forming a mask pattern by patterning the mask layer to expose the active region and a portion of an adjacent device isolating layer in an isolated hole type pattern; and anisotropically etching the exposed active region and the portion of the adjacent device isolating layer using the mask pattern as an etch mask, thereby forming a recess channel trench with the isolated hole type pattern, wherein an etch selectivity of the semiconductor substrate material to the device isolating layer during anisotropic etching is set as 1:1.

2. The method of forming a recess channel trench pattern of claim 1, wherein a bottom surface of the recess channel trench with the isolated hole type pattern formed by anisotropic etching is substantially flat.

3. A method of fabricating a recess channel trench pattern, the method comprising:

forming a device isolating layer in a semiconductor substrate that defines:

a first group of active regions arranged in a vertical first column, an intervening region of the device isolating layer between each of the active regions of the first group, and a second group of active regions arranged in a second column parallel to the first column, each of the active regions of the second group being adjacent to the intervening region of the device isolating layer;

forming a mask layer on the semiconductor substrate;

forming a mask pattern of parallel linear columns that cross the first group of active regions and the intervening region of the device isolating layer, the mask pattern exposing the first group of active regions within the parallel linear columns and concealing the intervening region within the parallel linear columns in an isolated hole type pattern; and anisotropically etching the exposed active regions using the mask pattern as an etch mask, thereby forming a recess channel trench with the isolated hole type pattern.

4. The method of fabricating a recess channel trench pattern of claim 3, wherein, when forming the recess channel trench with the isolated hole pattern, an etch selectivity of the semiconductor substrate material to the adjacent device isolating layer during anisotropic etching is set as 1:1.

5. The method of fabricating a recess channel trench pattern of claim 3, wherein, when forming the recess channel trench with the isolated hole pattern, a bottom surface of the recess channel trench with the isolated hole type pattern formed by anisotropic etching is substantially flat.

6. The method of fabricating a recess channel trench pattern of claim 3, further comprising forming source and drain regions in the active region between the step of defining the active region and the step of forming the mask layer.

7. The method of fabricating a recess channel trench pattern of claim 3, further comprising forming a recess gate that fills the recess channel trench to form a recess channel transistor, wherein the forming of the recess gate comprises:
  forming a gate insulating layer along an inner wall of the recess channel trench;
  sequentially stacking a gate conductive layer and a capping layer that fill the recess channel trench on the gate insulating layer; and
  patterning the gate conductive layer and the capping layer.

8. The method of fabricating a recess channel trench pattern of claim 3, wherein the concealed intervening region is adjacent to the active region of the second group.

9. A method of forming a recess channel trench pattern comprising:
  forming a device isolating layer in a semiconductor substrate that defines a pair of active regions having an intervening device isolating layer region therebetween, and that defines a third active region adjacent to the intervening device isolating layer region;
  forming a mask layer on the semiconductor substrate;
  patterning the mask layer to include a linear region that crosses the pair of active regions and the intervening device isolating layer region, the linear region having alternating first and second portions, the first portions exposing the pair of active regions and the second portions covering the intervening device isolating layer region adjacent to the third active region; and
  anisotropically etching the exposed active regions using the mask pattern as an etch mask, thereby forming a recess channel trench With an isolated hole type pattern.

10. The method of forming a recess channel trench pattern of claim 9, wherein, when forming the recess channel trench with the isolated hole type pattern, an etch selectivity of the semiconductor substrate material to the intervening device isolating layer during anisotropic etching is set as 1:1.

* * * * *

UNITED STATES PATENT AND TRADEMARK OFFICE
CERTIFICATE OF CORRECTION

PATENT NO.        : 7,205,199 B2                                          Page 1 of 1
APPLICATION NO.   : 10/917615
DATED             : April 17, 2007
INVENTOR(S)       : Jong-Chul Park et al.

It is certified that error appears in the above-identified patent and that said Letters Patent is hereby corrected as shown below:

Column 12, line 21, the word "With" should read -- with --.

Signed and Sealed this

Twelfth Day of August, 2008

JON W. DUDAS
*Director of the United States Patent and Trademark Office*